United States Patent [19]
Asai et al.

[11] Patent Number: 5,784,777
[45] Date of Patent: Jul. 28, 1998

[54] ELECTRONIC-COMPONENT REMOVING SYSTEM

[75] Inventors: Koichi Asai, Nagoya; Kunio Oe, Chiryu, both of Japan

[73] Assignee: Fuji Machine Mfg. Co., Ltd., Chiryu, Japan

[21] Appl. No.: 645,489

[22] Filed: May 13, 1996

[30] Foreign Application Priority Data

May 18, 1995 [JP] Japan ................................. 7-119455

[51] Int. Cl.$^6$ ................................................ H05K 3/30
[52] U.S. Cl. .......................... 29/832; 29/407.04; 29/840; 439/71
[58] Field of Search ........................ 29/407.04, 827, 29/832, 833, 840; 439/71

[56] References Cited

FOREIGN PATENT DOCUMENTS

| | | |
|---|---|---|
| Y2-62-21037 | 5/1987 | Japan . |
| B2-1-47918 | 10/1989 | Japan . |
| B2-2-50640 | 11/1990 | Japan . |
| A-4-345097 | 12/1992 | Japan . |

*Primary Examiner*—W. Donald Bray
*Attorney, Agent, or Firm*—Oliff & Berridge, PLC

[57] ABSTRACT

An electronic-component ("EC") removing system including a supplying device which feeds an EC carrier tape in a feeding direction parallel to a length-wise direction of an adhesive tape of the carrier tape, a thrusting device including a thrust member and a first actuator which moves the thrust member between a thrusted and a retracted position through an opening of the adhesive tape in a thrusting direction perpendicular to the feeding direction, and a receiving device including a holder which holds each of ECs adhered to the adhesive tape, a movable member which supports the holder such that the holder is movable relative thereto, and a second actuator which moves the movable member between an EC removing position in which the holder is opposed via each EC to the thrust member and, when the thrust member is moved to the thrusted position through the opening of the adhesive tape to thrust each EC toward the holder, the holder is moved with each EC relative to the movable member in the thrusting direction to remove each EC from the adhesive tape, and a different position thereof away from the EC removing position.

24 Claims, 23 Drawing Sheets

ELECTRONIC-COMPONENT REMOVING SYSTEM

BACKGROUND OF THE INVENTION

1. Field of the Invention

The present invention relates to an electronic-component removing system which removes an electronic component from a carrier tape and in particular to such a system which removes, from a carrier tape, each of electronic components adhered to an adhesive tape of the carrier tape.

2. Related Art Statement

There is known an electronic-component ("EC") supplying device which supplies a carrier tape carrying a number of electronic components ("ECs"). A known carrier tape includes an EC accommodating tape having a number of pockets which are provided at a regular interval of distance in a length-wise direction thereof and in which ECs are accommodated, respectively, and a cover tape which closes the respective upper openings of the pockets. As the carrier tape is fed, the cover tape is peeled from the EC accommodating tape, so that each of the ECs may be picked up from a corresponding one of the pockets of the carrier tape.

However, the prior carrier tape suffers from some problems. Each EC is accommodated in one pocket of the carrier tape such that a contact surface of the EC which is to contact an EC pick-up head faces the cover tape. For example, in the case of a carrier tape carrying ECs each of which is provided by a semiconductor chip and very small solder bumps directly formed on the chip, the solder bumps cannot be formed on the contact surface of each EC and accordingly are formed on the opposite surface of the same. Thus, the solder bumps cannot help contacting the bottom surface of the pocket and accordingly may be damaged.

In the above background, it has been proposed that the contact surface of each EC be adhered to an adhesive tape. For example, a known carrier tape includes a pair of adhesive tapes which are spaced apart from each other in a direction perpendicular to a length-wise direction of the adhesive tapes and to which ECs are adhered at a regular interval of distance in the length-wise direction, such that a pair of opposite end portions of each EC are adhered to the two adhesive tapes, respectively. In this case, the contact surface of each EC is supported by the adhesive tape, such that the solder bumps provided on the opposite surface of the EC do not contact anything else. Thus, each EC can be supplied without the problem of damaging thereof.

SUMMARY OF THE INVENTION

It is therefore a first object of the present invention to provide an electronic-component removing system for removing each electronic component from one or more adhesive tapes, by utilizing a thrust member.

It is a second object of the present invention to provide a process of mounting each electronic component removed from one or more adhesive tapes by utilizing a thrust member.

It is a third object of the present invention to provide an electronic-component removing system for removing each electronic component from adhesive tapes, by peeling the adhesive tapes from the electronic component.

It is a fourth object of the present invention to provide a process of mounting each electronic component removed from adhesive tapes by peeling the adhesive tapes from the electronic component.

It is a fifth object of the present invention to provide an electronic-component supplying cartridge for supplying each electronic component adhered to one or more adhesive tapes, by utilizing a thrust member.

The above first object has been achieved according to a first aspect of the present invention, which provides an electronic-component removing system for removing each of a plurality of electronic components from a carrier tape including at least one elongate adhesive tape to which the components are adhered at a regular interval of distance in a length-wise direction of the adhesive tape, the adhesive tape having at least one opening formed through the thickness thereof, the each of the components adhered to the adhesive tape being exposed through the opening, the removing system comprising a supplying device which supports the carrier tape and feeds the carrier tape in a feeding direction parallel to the length-wise direction of the adhesive tape; a thrusting device provided on one side of the adhesive tape of the carrier tape supported by the supplying device, the one side of the adhesive tape being opposite to the other side thereof on which the components are, the thrusting device including a thrust member and a first actuator which moves the thrust member between a thrusted position thereof and a retracted position thereof through the opening of the adhesive tape in a thrusting direction substantially perpendicular to the feeding direction; and a receiving device provided on one side of the components of the carrier tape supported by the supplying device, the one side of the components being opposite to the other side thereof on which the adhesive tape is, the receiving device including a holder which holds the each of the components adhered to the adhesive tape, a movable member which supports the holder such that the holder is movable relative thereto, and a second actuator which moves the movable member between an electronic-component removing position thereof in which the holder supported by the movable member is opposed via the each component to the thrust member and, when the thrust member is moved by the first actuator to the thrusted position through the opening of the adhesive tape to thrust the each component toward the holder, the holder is moved with the each component relative to the movable member in the thrusting direction to remove the each component from the adhesive tape, and a different position thereof away from the removing position.

In the electronic-component ("EC") removing system in accordance with the first aspect of the invention, the carrier tape is fed by the supplying device so that the leading one of the ECs adhered to the adhesive tape is moved to the EC removing position. At this time, the thrust member is located at its retracted position. After the feeding of the carrier tape is stopped, the thrust member is moved from the retracted position to its thrusted position. At this time, the holder is located at the EC removing position. When the thrust member is moved to the thrusted position, first the holder cooperates with the thrust member to sandwich the EC and subsequently the two elements are moved in a direction away from the adhesive tape. Thus, the EC is thrusted by the thrust member and is removed from the adhesive tape. Thereafter, the holder holding the EC removed from the adhesive tape is moved to its different position away from the EC removing position. At the different position, the holder may hand over the EC to an EC suction head of an EC mounting device, for example. The carrier tape may include a pair of elongate adhesive tapes which are spaced apart from each other in a direction perpendicular to a length-wise direction of the adhesive tapes and to which ECs are adhered at a regular interval of distance in the length-wise direction, such that a pair of opposite end portions of each EC is adhered to the two adhesive tapes, respectively.

In this case, the opening formed through the thickness of the adhesive tape may be provided by the spacing between the two adhesive tapes. Alternatively, the carrier tape may include a single adhesive tape having a plurality of through-holes which are formed through a plurality of portions of the adhesive tape to which ECs are adhered, respectively, at a regular interval of distance and each of which permits the thrust member to be moved therethrough. In the latter case, the through-holes provide a plurality of openings each formed through the thickness of the adhesive tape. At the EC removing position, the holder may be brought into contact with the EC, either before or after the thrust member starts to thrust the EC. The holder may be one of various sorts of known devices, such as a suction device which attracts an EC by air suction, or a chuck device which holds an EC using a pair of jaws. Thus, the present system automatically deals with the ECs being supplied in the form of the carrier tape and removes each EC from the adhesive tape of the carrier tape.

According to a preferred feature of the first aspect of the invention, the supplying device comprises a stopper member provided on the one side of the components, the stopper member stopping a movement of the adhesive tape in the thrusting direction when the thrust member is moved to the thrusted position by the first actuator. In this case, when each EC is thrusted by the thrust member, the stopper member stops the movement of the adhesive tape with the EC in the thrusting direction. Thus, the adhesive tape is left in the supplying device and each EC is easily removed from the adhesive tape.

According to another feature of the first aspect of the invention, the movable member of the receiving device comprises a rotatable arm which is rotatable about an axis line parallel to an adhesion surface of the adhesive tape to which the components are adhered, and the holder of the receiving device is supported by the rotatable arm such that the holder is movable relative to the arm in a direction tangent to a locus of movement thereof drawn when the arm is rotated by the second actuator. In this case, the axis line of rotation of the rotatable arm may be perpendicular, parallel, or inclined, to the lengthwise direction of the adhesive tape.

According to another feature of the first aspect of the invention, the receiving device further comprises a supporting device which supports the holder, allows the movement of the holder relative to the movable member, and stops the movement of the holder at a position within a predetermined range relative to the movable member, and a returner which returns the holder stopped by the supporting device at a position to which the holder is moved with the each component relative to the movable member when the thrust member is moved to the thrusted position, to an initial position thereof corresponding to one of opposite ends of the predetermined range. In this case, when each EC is thrusted by the thrust member, the holder and the thrust member are moved as a unit while sandwiching the EC therebetween. When the thrust member is moved to the thrusted position, the movement of the holder is stopped. Therefore, even if because of machining and/or assembling errors, etc., the movable member may not be located with accuracy at the EC removing position, or even if different sorts of ECs having somewhat different dimensions are supplied by the supplying device, the holder can holds each EC with high reliability. The holder holding the EC is moved with the movable member while the position of the holder relative to the movable member is maintained, by the supporting device, to the position to which the holder has been moved with the EC relative to the movable member when the thrust member is moved to the thrusted position. The returner may return the position of the holder relative to the movable member, from the maintained position to its initial position, when the movable member is moved to its different position away from the EC removing position. Thus, the holder is ready for holding another EC.

According to another feature of the first aspect of the invention, the receiving device further comprises a cushion member formed of a resilient material, the cushion member being provided on an end face of the holder at which the holder contacts the each component. The resilient material may be rubber, soft synthetic resin, or the like. Since the holder contact each EC via the cushion member, the degree of air tightness between the holder and the EC is improved. In the case where very small solder bumps are formed on the contact surface of each EC, the solder bumps are effectively prevented from being damaged resulting from contacting the holder.

The second object has been achieved according to a second aspect of the present invention, which provides a process of mounting each of a plurality of electronic components on a printed circuit board, comprising the steps of supporting a carrier tape including at least one elongate adhesive tape to which the components are adhered at a regular interval of distance in a length-wise direction of the adhesive tape, the adhesive tape having at least one opening formed through the thickness thereof, the each of the components adhered to the adhesive tape being exposed through the opening, feeding the carrier tape in a feeding direction parallel to the length-wise direction of the adhesive tape, moving a thrust member between a thrusted position thereof and a retracted position thereof through the opening of the adhesive tape, in a thrusting direction substantially perpendicular to the feeding direction, moving a movable member between an electronic-component removing position thereof in which a holder supported by the movable member is opposed via the each component to the thrust member and, when the thrust member is moved to the thrusted position through the opening of the adhesive tape to thrust the each component toward the holder, the holder is moved with the each component relative to the movable member in the thrusting direction to remove the each component from the adhesive tape, and a different position thereof away from the removing position, and mounting the each component removed from the adhesive tape, on the printed circuit board.

The EC mounting process in accordance with the second aspect of the invention enjoys the same functions and advantages as those of the EC removing system in accordance with the first aspect of the invention. In addition, since the ECs are mounted intact or safe on the printed circuit board ("PCB"), an electronic assembly including the PCB and the ECs enjoys an improved quality.

According to a preferred feature in accordance with the second aspect of the invention, the process further comprises the step of stopping a movement of the adhesive tape in the thrusting direction when the thrust member is moved to the thrusted position.

According to another feature in accordance with the second aspect of the invention, the step of moving the movable member comprises rotating a rotatable arm as the movable member about an axis line parallel to an adhesion surface of the adhesive tape to which the components are adhered, the rotatable arm supporting the holder such that the holder is movable relative to the arm in a direction tangent to a locus of movement thereof drawn when the arm is rotated.

According to another feature in accordance with the second aspect of the invention, the process further comprises the steps of allowing the movement of the holder relative to the movable member, stopping the holder at a position within a predetermined range relative to the movable member, and returning the holder stopped at a position to which the holder is moved with the each component relative to the movable member when the thrust member is moved to the thrusted position, to an initial position thereof corresponding to one of opposite ends of the predetermined range.

According to another feature in accordance with the second aspect of the invention, the process further comprises the step of holding the each component with the holder including a cushion member formed of a resilient material, the cushion member being provided on an end face of the holder at which the holder contacts the each component.

The third object has been achieved according to a third aspect of the present invention, which provides an electronic-component removing system for removing each of a plurality of electronic components from a carrier tape including a pair of elongate adhesive tapes which are spaced apart from each other in a direction perpendicular to a length-wise direction of the adhesive tapes and to which the components are adhered at a regular interval of distance in the length-wise direction, a pair of opposite end portions of the each component being adhered to the two adhesive tapes, respectively, the removing system comprising a take-up reel which is provided on one side of the adhesive tapes opposite to the other side thereof on which the components are, such that the take-up reel is rotatable about an axis line perpendicular to the lengthwise direction of the adhesive tapes and parallel to respective adhesion surfaces of the adhesive tapes to which the components are adhered; a drive device which rotates the take-up reel to peel the adhesive tapes from the each component and take up the adhesive tapes; and a component-movement preventing device which prevents the each component from being moved with the adhesive tapes when the adhesive tapes are peeled from the each component by the take-up reel.

In the electronic-component ("EC") removing system in accordance with the third aspect of the invention, each EC is removed from the adhesive tapes when the take-up reel is rotated to peel the adhesive tapes from the EC and take up the peeled tapes. During this step, each EC is prevented from being moved with the adhesive tapes, by the EC-movement preventing device. Thus, each EC is removed from the adhesive tapes with high reliability. The carrier tape may be fed by either an exclusive tape feeding device or the take-up reel (or a reel drive device for rotating the take-up reel). Thus, the present system automatically deals with the ECs being supplied in the form of the carrier tape and removes each EC from the adhesive tape of the carrier tape.

According to a preferred feature in accordance with the third aspect of the invention, the system further comprises a holder which holds the each component from which the adhesive tapes have been peeled by the take-up reel.

According to another feature in accordance with the third aspect of the invention, the component-movement preventing device comprises a cover member which covers respective surfaces of the adhesive tapes opposite to the adhesion surfaces thereof, and an actuator which moves the cover member from an advanced position thereof where the cover member covers the each component located at a tapepeeling position, to a retracted position thereof away from the advanced position, when the adhesive tapes are peeled from the each component and taken up by the take-up reel, the actuator moving the cover member from the retracted position to the advanced position when the carrier tape is fed forward after the adhesive tapes are peeled from the each component.

According to another feature in accordance with the third aspect of the invention, the system further comprises a holder which holds the each component carried on the carrier tape, wherein the cover member has a notch through which the holder is moved to hold the each component, the notch extending parallel to the length-wise direction of the adhesive tapes, and opening in a downstream-side end of the cover member in a direction in which the carrier tape is fed forward.

According to another feature in accordance with the third aspect of the invention, the component-movement preventing device comprises a preventing member and an actuator which moves the preventing member to an operative position thereof where the preventing member contacts a surface of the each component to which the adhesive tapes are adhered, and to an inoperative position thereof away from the operative position.

According to another feature in accordance with the third aspect of the invention, the take-up reel includes two take-up portions which are provided side by side on the axis line of rotation of the take-up reel and which take up the two adhesive tapes, respectively.

The fourth object has been achieved according to a fourth aspect of the present invention, which provides a process of mounting each of a plurality of electronic components on a printed circuit board, comprising the steps of supporting a carrier tape including a pair of elongate adhesive tapes which are spaced apart from each other in a direction perpendicular to a length-wise direction of the adhesive tapes and to which the components are adhered at a regular interval of distance in the length-wise direction, a pair of opposite end portions of the each component being adhered to the two adhesive tapes, respectively, rotating a take-up reel to peel the adhesive tapes from the each component and take up the adhesive tapes, the take-up reel being provided on one side of the adhesive tapes opposite to the other side thereof on which the components are, such that the take-up reel is rotatable about an axis line perpendicular to the lengthwise direction of the adhesive tapes and parallel to respective adhesion surfaces of the adhesive tapes to which the components are adhered, preventing the each component from being moved with the adhesive tapes when the adhesive tapes are peeled from the each component, picking up the each component from which the adhesive tapes have been peeled, and mounting the picked-up component on the printed circuit board.

The EC mounting process in accordance with the fourth aspect of the invention enjoys the same functions and advantages as those of the EC removing system in accordance with the third aspect of the invention. In addition, since the ECs are mounted intact or safe on the PCB, an electronic assembly including the PCB and the ECs enjoys an improved quality.

According to a preferred feature in accordance with the second aspect of the invention, the step of preventing the movement of the each component comprises moving a cover member which covers respective surfaces of the adhesive tapes opposite to the adhesion surfaces thereof, from an advanced position thereof where the cover member covers the each component located at a tape-peeling position, to a retracted position thereof away from the advanced position, when the adhesive tapes are peeled from the each component and taken up by the take-up reel, and moving the cover member from the retracted position to the advanced position when the carrier tape is fed forward after the adhesive tapes are peeled from the each component.

According to another feature in accordance with the second aspect of the invention, the step of removing the each component comprising moving a holder to hold the each component, through a notch formed through a thickness of the cover member, the notch extending parallel to the length-wise direction of the adhesive tapes, and opening in a downstream-side end of the cover member in a direction in which the carrier tape is fed forward.

According to another feature in accordance with the second aspect of the invention, the step of preventing the movement of the each component comprises moving a preventing member to an operative position thereof where the preventing member contacts a surface of the each component to which the adhesive tapes are adhered, and to an inoperative position thereof away from the operative position.

According to another feature in accordance with the second aspect of the invention, the step of rotating the take-up reel comprising rotating the take-up reel including two take-up portions which are provided side by side on the axis line of rotation of the take-up reel and which take up the two adhesive tapes, respectively.

The above fifth object has been achieved according to a fifth aspect of the present invention, which provides an electronic-component supplying cartridge for supplying each of a plurality of electronic components carried on a carrier tape including at least one elongate adhesive tape to which the components are adhered at a regular interval of distance in a length-wise direction of the adhesive tape, the adhesive tape having at least one opening formed through the thickness thereof, the each of the components adhered to the adhesive tape being exposed through the opening, the cartridge comprising a supplying device which supports the carrier tape and feeds the carrier tape in a feeding direction parallel to the length-wise direction of the adhesive tape; and a thrusting device provided on one side of the adhesive tape of the carrier tape supported by the supplying device, the one side of the adhesive tape being opposite to the other side thereof on which the components are, the thrusting device including a thrust member and an actuator which moves the thrust member between a thrusted position thereof and a retracted position thereof through the opening of the adhesive tape in a thrusting direction substantially perpendicular to the feeding direction, the thrust member being moved by the actuator to the thrusted position through the opening of the adhesive tape to thrust the each component and thereby remove the each component from the adhesive tape.

According to a preferred feature of the fifth aspect of the invention, the supplying device comprises a stopper member provided on the one side of the components, the stopper member stopping a movement of the adhesive tape in the thrusting direction when the thrust member is moved to the thrusted position by the actuator.

According to another feature of the fifth aspect of the invention, the actuator comprises an air-cylinder device including a piston to which the thrust member is fixed, the air-cylinder device moving the thrust member fixed to the piston, between the thrusted position and the retracted position through the opening of the adhesive tape.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Figure 1:
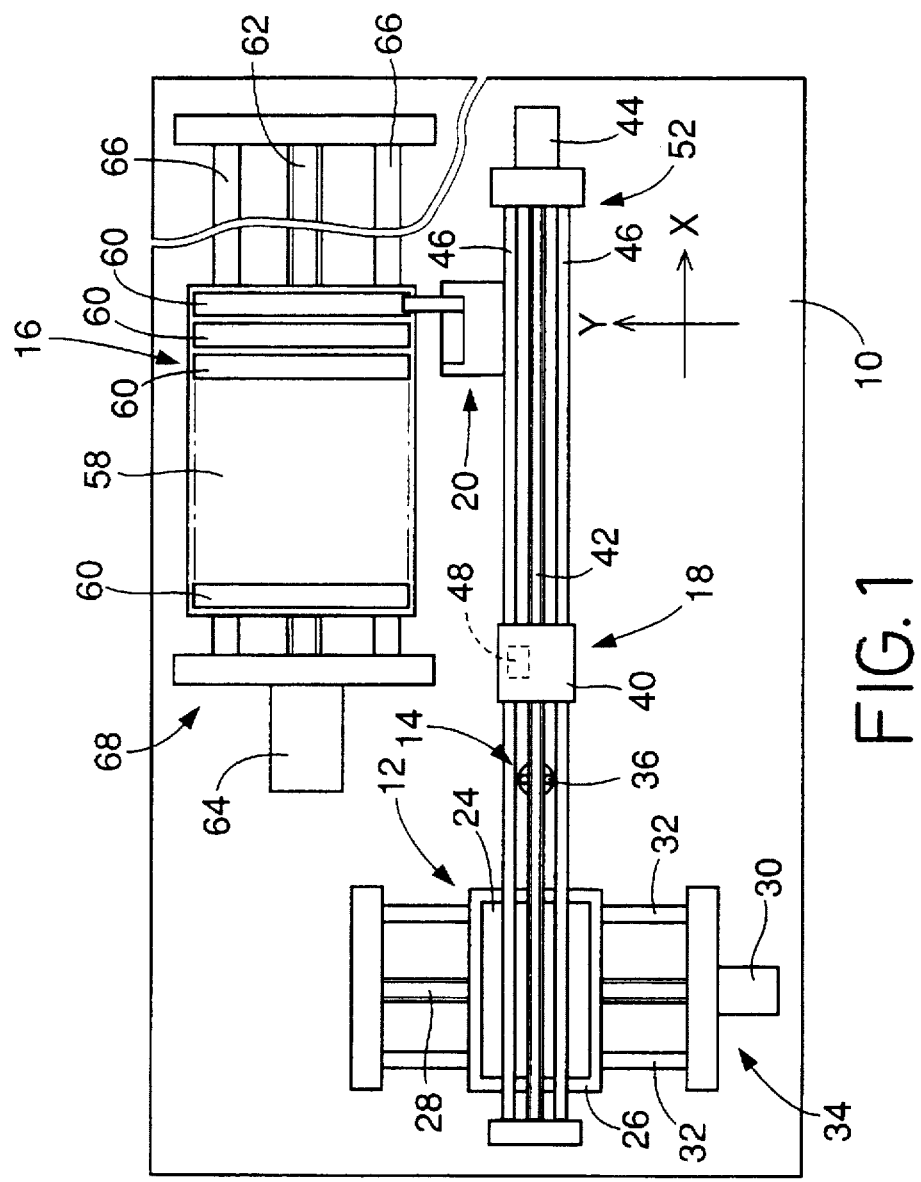
FIG. 1 is a plan view of an electronic-component ("EC") mounting system including an EC removing device as a first embodiment of the present invention.

Referring first to FIG. 1, there is shown an electronic-component mounting system including an electronic-component removing device 20 to which the present invention is applied.

Reference numeral 10 designates a base on which a printed-circuit-board (PCB) supporting and positioning device 12, an image taking device 14, and an electronic-component supplying device 16 are provided in the order of description in an X direction. An electronic-component mounting device 18 is provided in relation with the devices 12, 14, 16, and the electronic-component removing device 20 is provided in relation with the devices 16 and 18.

Figure 21:
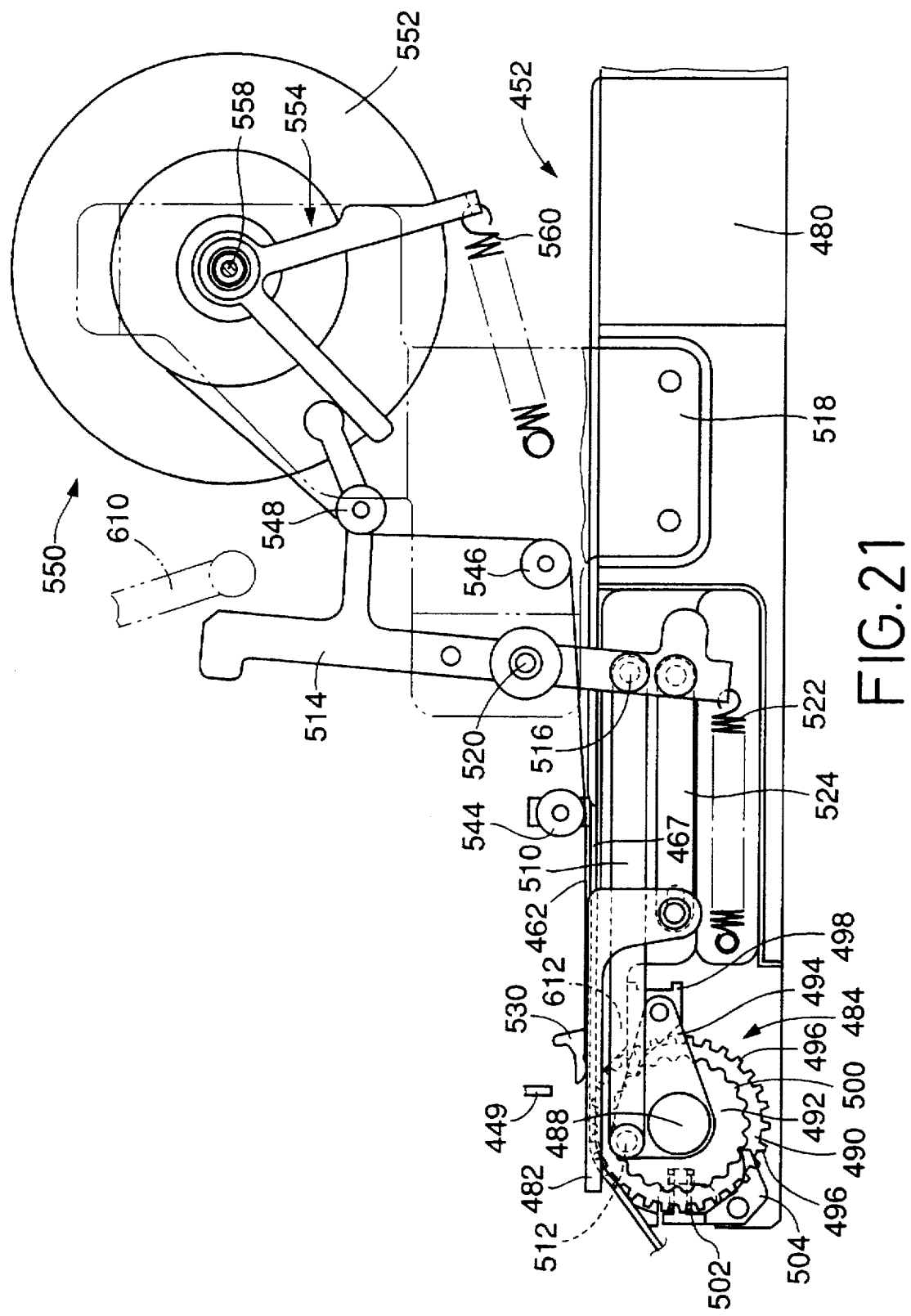
FIG. 21 is a side view of an EC supplying cartridge of the EC supplying device of FIG. 17.

The PCB supporting and positioning device 12 includes a Y-direction slide 26 which supports and positions a printed circuit board ("PCB") 24 and which is movable in a Y direction (i.e., both positive and negative directions) perpendicular to the X direction in a horizontal plane. The Y-direction slide 26 is threadedly engaged with a ball screw 28 via a nut (not shown), and moved in the Y direction by being guided by a pair of guide rails 32, 32 when the ball screw 28 is rotated by an Y-direction servomotor 30 (FIG. 21). The nut, ball screw 28, Y-direction servomotor 30, guide rails 32, etc. cooperate with one another to provide a PCB moving device 34.

The image taking device 14 includes a line-image sensor 36 which is provided by a number of light-detecting elements arranged in an array in the Y direction. The sensor 36 continuously takes images of an electronic component 70 (FIG. 2) as the component 70 is moved over the sensor 36, thereby providing a two-dimensional image of the component 70.

The electronic-component mounting device 18 includes a first X-direction slide 40. The first X-direction slide 40 is threadedly engaged with a ball screw 42 via a nut (not shown), and moved in the X direction (i.e., both positive and negative directions) by being guided by a pair of guide rails 46, 46 when the ball screw 42 is rotated by a first X-direction servomotor 44. The nut, ball screw 42, X-direction servomotor 44, guide rails 46, etc. cooperate with one another to provide a suction-head moving device 52. A suction head 48 is mounted on the X-direction slide 40 such that the suction head 48 is moved up and down by a drive device (not shown). The suction head 48 includes a suction nozzle 50 (FIG. 8) which is supplied with a vacuum or negative pressure to attract and hold an electronic component 70 by air suction.

The electronic-component supplying device 16 includes a second X-direction slide 58 on which a number of electronic-component supplying cartridges 60 are mounted in an array in the X direction. The second X-direction slide 58 is threadedly engaged with a ball screw 62 via a nut (not shown), and moved in the X direction (i.e., both positive and negative directions) by being guided by a pair of guide rails 66, 66 when the ball screw 62 is rotated by a second X-direction servomotor 64. The nut, ball screw 62, X-direction servomotor 64, guide rails 66, etc. cooperate with one another to provide a cartridge moving and positioning device 68 which moves the X-direction slide 58 in the X direction and positions a desired one of the cartridges 60 at an electronic-component removing position which will be described later.

Figure 2:
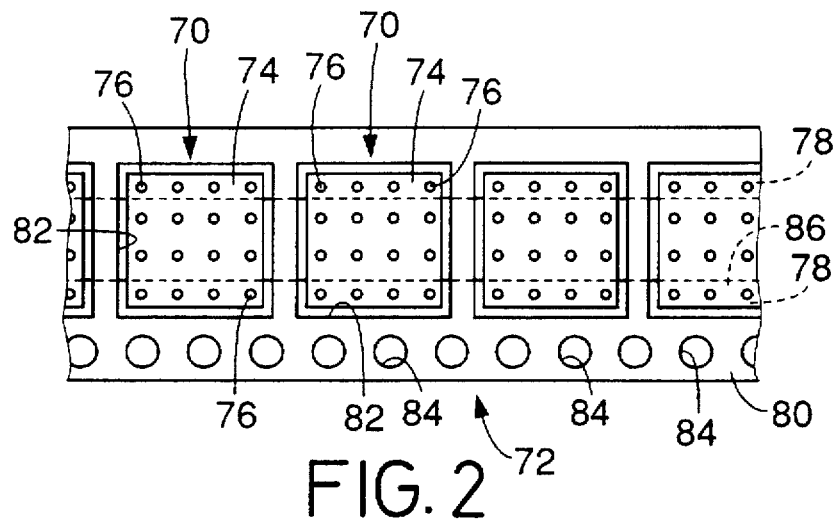
FIG. 2 is a plan view of an EC carrier tape which is supplied by an EC supplying device of the EC mounting system of FIG. 1.
Figure 3:
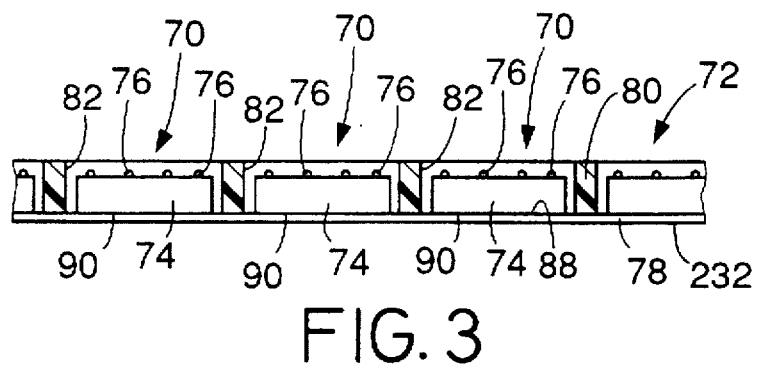
FIG. 3 is a cross-section view of the carrier tape of FIG. 2.
Figure 4:
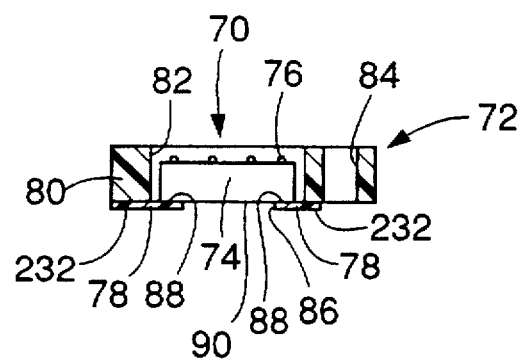
FIG. 4 is another cross-section view of the carrier tape of FIG. 2.

Each supplying cartridge 60 supplies electronic components 70 carried by a carrier tape 72 shown in FIGS. 2 through 4. Each component 70 is a semiconductor chip 74 which is provided with a number of solder bumps 76 on one of opposite major surfaces thereof. The carrier tape 72 includes a pair of parallel adhesive tapes 78, and a spacer tape 80 which protects the components 70 adhered to the adhesive tapes 78.

The spacer tape 80 has a number of electronic-component accommodating holes 82 formed through the thickness thereof at a regular interval of distance in a length-wise direction thereof. The spacer tape 80 also has a number of tape feeding holes 84 formed through the thickness thereof at a different regular interval of distance in the length-wise direction thereof. The pair of parallel adhesive tapes 78 are adhered to one of opposite surfaces of the spacer tape 80 such that respective inner portions of the two tapes 78 partially cover respective openings of the electronic-component accommodating holes 82 and are spaced apart from each other in a width-wise direction of the spacer tape 80 perpendicular to the length-wise direction thereof. Respective inner edge lines of the two tapes 78 extend parallel to each other in the length-wise direction of the spacer tape 80, and cooperate with each other to define respective spacings which function as through-holes 86 provided through the thickness of the adhesive tapes 78.

Respective upper surfaces of the inner portions of the two adhesive tapes 78 which cover the respective openings of the electronic-component accommodating holes 82, provide adhesion surfaces 88, 88 to which the other surface of each electronic component 70 opposite to one surface thereof provided with the solder bumps 76 is adhered. In the state in which the components 70 are adhered to the adhesion surfaces 88 of the adhesive tapes 78 in the accommodating holes 82, the solder bumps 76 do not project out of the upper surface of the spacer tape 80 opposite to the lower surface thereof adhered to the adhesive tapes 78.

Figure 5:
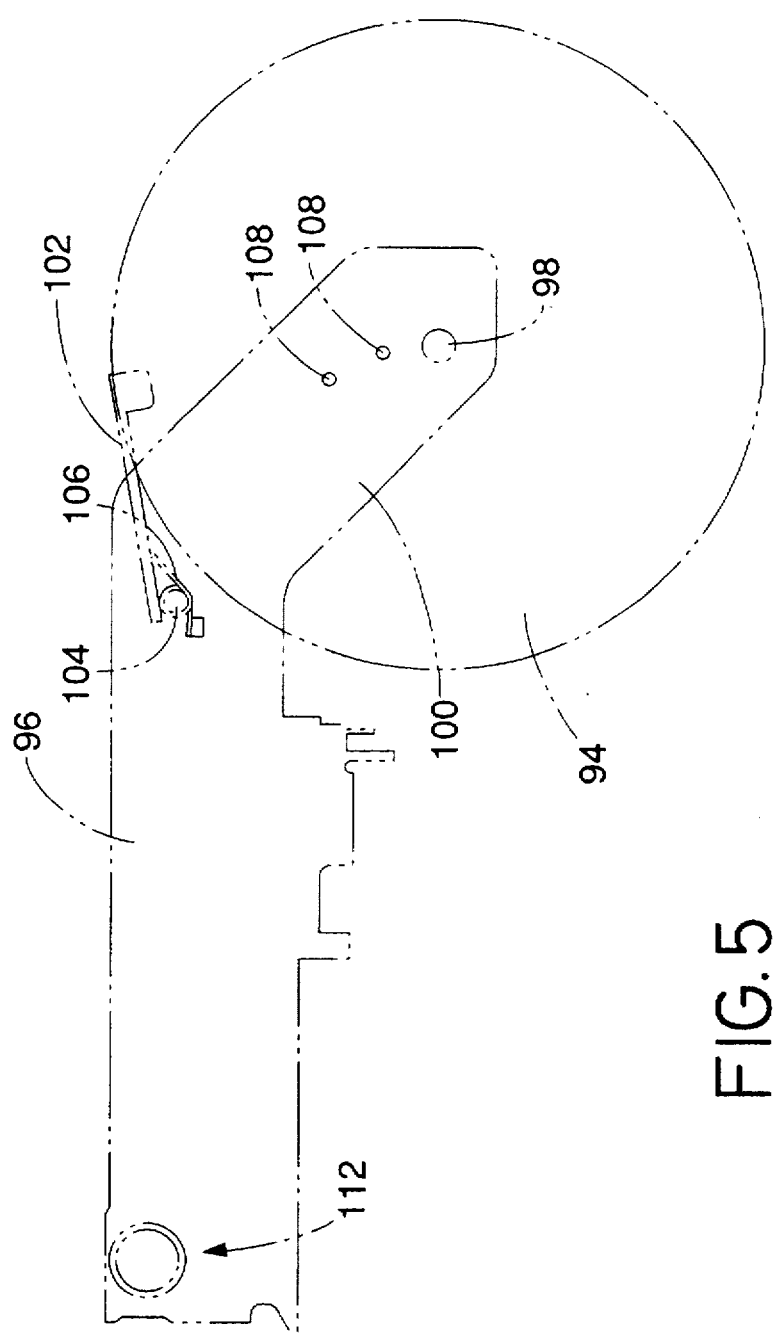
FIG. 5 is an illustrative side view of an EC supplying cartridge as one element of the EC supplying device.

As shown in FIG. 5, the carrier tape 72 is wound around a tape reel 94. Since the electronic components 70 are adhered to the adhesive tapes 78 in the accommodating holes 82 of the spacer tape 80, the solder bumps 76 are prevented from being contacted with something else or being damaged due to such contact, even in the state in which the carrier tape 72 is wound around the tape reel 94.

The tape reel 94, around which the carrier tape 72 is wound, is detachably attached to a rear end portion 100 of a cartridge frame 96 via an axis member 98. A resisting member 102 is rotatably attached to the end portion 100 via an axis member 104, and a spring 106 biases the resisting member 102 in a direction in which the resisting member 102 contacts an outer circumferential surface of the tape reel 94. Thus, the resisting member 102 appropriately resists the rotation of the tape reel 94.

The end portion 100 has a plurality of insertion holes 108 in each of which the axis member 98 can be inserted. The insertion holes 108 are provided for the purpose of holding different sizes of tape reels 94 having different diameters, so that the resisting member 102 can apply an appropriate resistance to the rotation of each tape reel 94.

Figure 6:
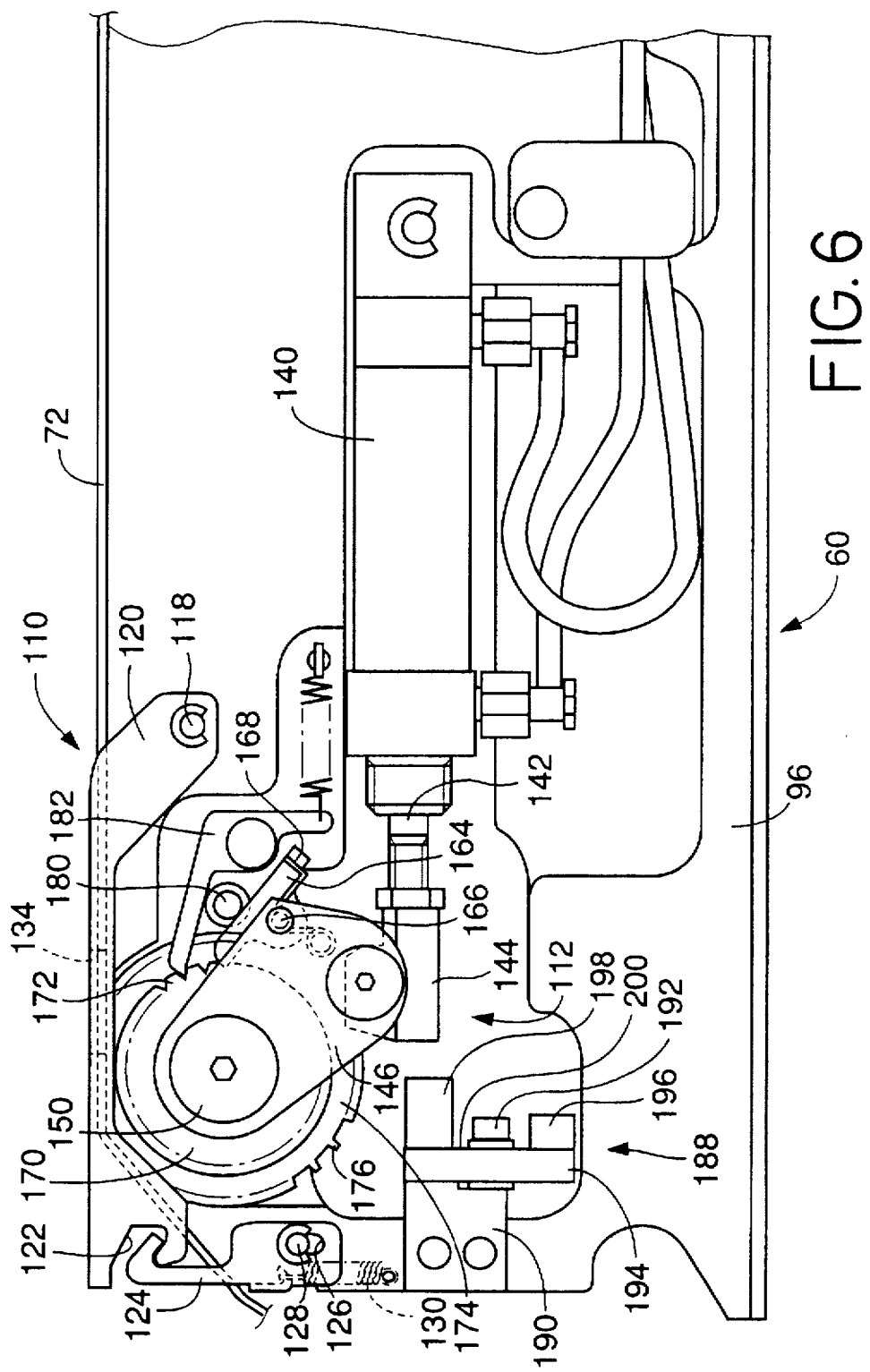
FIG. 6 is a side view of a tape feeder of the EC supplying cartridge of FIG. 5.

The cartridge frame 96 has a shape like an elongate and thin box, and stands such that the length-wise and thickness-wise directions thereof are horizontal and the width-wise direction thereof is vertical. As shown in FIG. 6, the carrier tape 72 is placed, after being drawn out of the tape reel 94, on an upper surface of the cartridge frame 96 and is fed forward under a cover member 110, by a tape supporting and feeding device 112 (hereinafter, referred to as the "tape feeder" 112). The tape feeder 112 intermittently feeds the carrier tape 72 in an electronic-component feeding direction parallel to the Y direction, by a predetermined feeding pitch equal to the distance of respective centers of each pair of adjacent accommodating holes 82 of the spacer tape 80.

Figure 7:
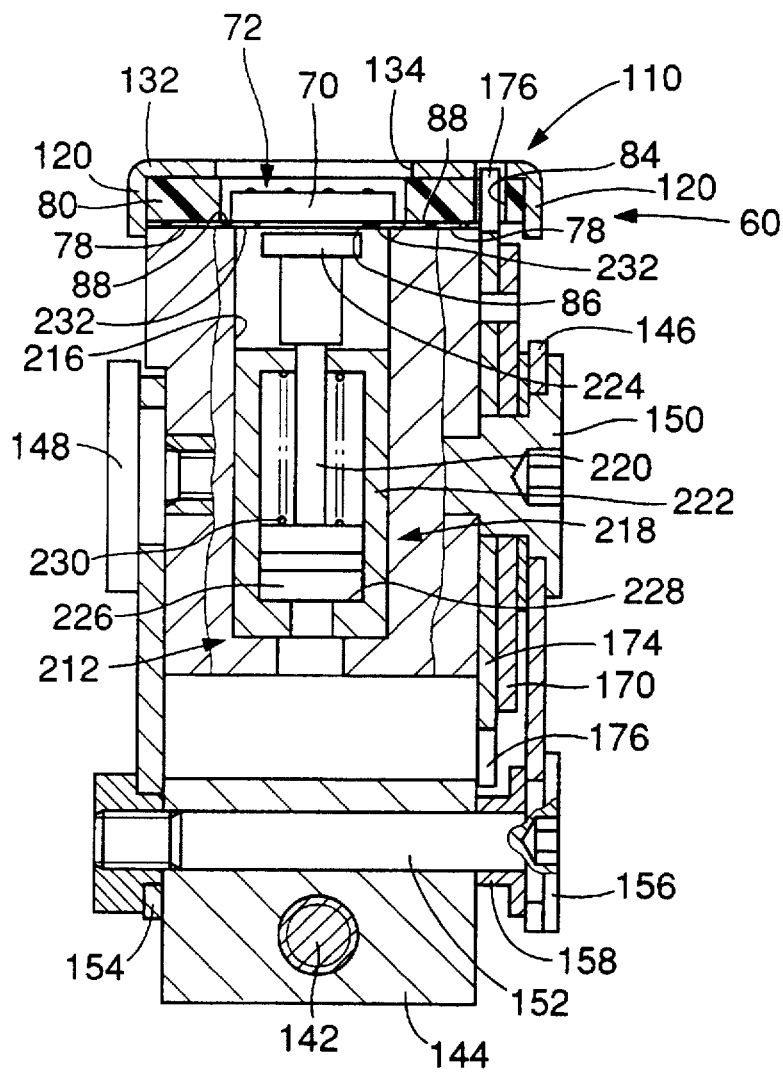
FIG. 7 is a transverse cross-section view of the EC supplying cartridge of FIG. 5, showing a thrust-up device of the EC removing device of FIG. 1.

The cover member 110 has a generally U-shaped cross section, and is rotatably attached, at a rear end portion thereof, to the cartridge frame 96 via an axis member 118. The cover member 110 has a pair of side plates 120 (only one 120 is shown in FIG. 6). The two side plates 120 have respective engagement recesses 122 with which a pair of engagement members 124 attached to the cartridge frame 96 are engaged, respectively. The two engagement members 124 have respective vertically elongate holes 126 through which pins 128 fixed to side surfaces of the cartridge frame 96 extends such that the engagement members 124 are movable relative to the pins 128 or frame 96. The engagement members 124 are biased downward by a spring 130. Thus, the engagement members 124 are engaged with the cover member 110 such that the former 124 cannot be disengaged from the latter 110. In addition, as shown in FIG. 7, the engagement members 124 biases the cover member 110 downward so that a bottom surface of a top plate 132 of the cover member 110 which connects between the two side plates 120 can contact an upper surface of the spacer tape 80 of the carrier tape 72, thereby preventing the carrier tape 72 from jumping up out of the cartridge frame 96. The top plate 132 has a rectangular opening 134 which is formed through the thickness thereof and which has appropriate dimensions which permit the electronic components 70 to pass therethrough.

The tape feeder 112 includes a tape-feed air cylinder 140 which is of a double-action type. The air cylinder 140 has two air chambers which are selectively communicated with an air source (not shown) and the atmosphere, respectively. A piston rod 142 is advanced from, or retracted into, the air cylinder 140, depending upon a current operating mode of the air cylinder 140. A stopper block 144 is fixed to an end portion of the piston rod 142, and a rotary plate 146 is connected to the stopper block 144 such that the rotary plate 146 is rotatable relative to the stopper block 144 via an axis member 152 (FIG. 7).

As shown in FIG. 7, a first end portion of the rotary plate 146 is connected to one of opposite ends of an axis member 150 which is fixed to the cartridge frame 98 by being fastened with a screw member 148. Thus, the rotary plate 146 is rotatable about a horizontal axis line perpendicular to the electronic-component ("EC") feeding direction. A second end portion of the rotary plate 146 is connected to the axis member 152 fixed to the stopper block 144 such that the rotary plate 146 is rotatable relative to the stopper block 144. When the piston rod 142 is retracted or advanced by the air cylinder 140, the rotary plate 146 is rotated in a forward or a backward direction thereof, respectively, as seen at the place where the carrier tape 72 is fed on the upper surface of the cartridge frame 96. Opposite end portions of the axis member 152 project from the stopper block 144. The rotary plate 146 is connected to one of the two end portions of the axis member 152, and a link 154 is connected to the other end portion of the axis member 152 such that the link 154 is rotatable relative to the axis member 152. The link 154 also connected to the other end portion of the axis member 150 such that the rotary plate 146 is rotatable relative to the axis member 150. The rotary plate 146 is sandwiched with precision between a head portion 78 of the axis member 152 and a flange of a sleeve 158, such that the rotation of the rotary plate 146 relative to the axis member 152 and the stopper block 144 is permitted and the tiling of the axis member 152 is prevented. Thus, the link 77 functions to prevent the tilting of the axis member 152.

As shown in FIG. 6, a ratchet pawl 164 is rotatably attached to a central portion of the rotary plate 146 via an axis member 166. A spring 168 biases the ratchet pawl 164 in a direction in which the pawl 164 engages teeth 172 of a ratchet wheel 170. The ratchet wheel 170 is fixed to a sprocket 174 such that the wheel 170 is not rotatable relative to the sprocket 174. The sprocket 174 is rotatably supported by the axis member 150.

Teeth 176 of the sprocket 174 are engaged with the tape-feeding holes 84 of the spacer tape 80 of the carrier tape 72. When the piston rod 142 is retracted and the rotary plate 146 is rotated in the forward direction, the ratchet pawl 164 supported by the rotary plate 146 is moved while keeping the engagement with the teeth 172 of the ratchet wheel 170. Thus, the ratchet wheel 170 is rotated in a forward direction thereof and accordingly the sprocket 174 is rotated in a forward direction thereof. Consequently the carrier tape 72 is fed in the EC feeding direction.

The limit of forward-direction rotation of the rotary plate 146 is defined by a stopper projection 180 on which the ratchet pawl 164 is abutable. The stopper projection 180 is fixed to the cartridge frame 96. Thus, the tape feeder 112 feeds the carrier tape 72 such that the leading one of the electronic components 70 held on the adhesive tapes 78 is sent to a predetermined electronic-component (EC) supplying position where each component 70 is removed from the adhesive tapes 78 by the removing device 20. The EC supplying position is located adjacent to the position where the teeth 176 of the sprocket 174 are engaged with the tape-feeding holes 84 of the spacer tape 80, on the upstream side of that position as seen in the EC feeding direction.

When the piston rod 142 is advanced by the air cylinder 140 and the rotary plate 146 is rotated in the backward direction thereof, the ratchet pawl 164 moves over some of the teeth 172 of the ratchet wheel 170. However, the rotation of the ratchet wheel 170 is inhibited by a stopper lever 182. Thus, the spacer tape 80 is prevented from moving backward opposite to the EC feeding direction, and the leading electronic component 70 is prevented from moving out of the EC supplying position. The stopper lever 182 functions to position the leading component 70 at the EC supplying position.

When the rotary plate 146 is rotated in the forward direction, the ratchet wheel 170 is rotated by an angle equal to a central angle corresponding to the number of teeth 172 which the ratchet pawl 164 had moved over during the preceding backward-direction rotation of the rotary plate 146. Thus, the pitch of feeding of the carrier tape 72 is defined as the number of teeth 172 which the ratchet pawl 164 moves over in each backward-direction rotation of the rotary plate 146. Therefore, the feeding pitch of the carrier tape 72 can be changed by changing the limit of backward-direction rotation of the rotary plate 146.

The limit of backward-direction rotation of the rotary plate 146 is defined by a backward-direction stopping device 188 provided on the cartridge frame 96. The stopping device 188 includes a base member 190 fixed to the cartridge frame 96, and a rotary member 194 secured to the base member 190 with a bolt 192. The rotary member 194 includes a first and a second stopper projection 196, 198 diametrically opposite to each other, and a recess (not shown) intermediate between the two projections 196, 198. The two projections 196, 198 have different lengths or heights.

By loosening the bolt 192, the rotary member 194 is made rotatable relative to the base member 190. Thus, the rotary member 194 can be rotated and adjusted such that the stopper block 144 fixed to the piston rod 142 faces one of the first and second stopper projections 196, 198, an end face of the base member 194 through the recess of the rotary member 194, and an end face 200 of the rotary member 194 free from the projection or recess 196, 198, 194. Thus, the rotary member 194 and the base member 190 cooperate with each other to define four rotation-limit defining positions corresponding to four limits of backward-direction rotation of the rotary plate 146, respectively. Thus, the pitch of feeding of the carrier tape 72 can be selected from four different values.

Next, the electronic-component (EC) removing device 20 will be described in detail.

Figure 8:
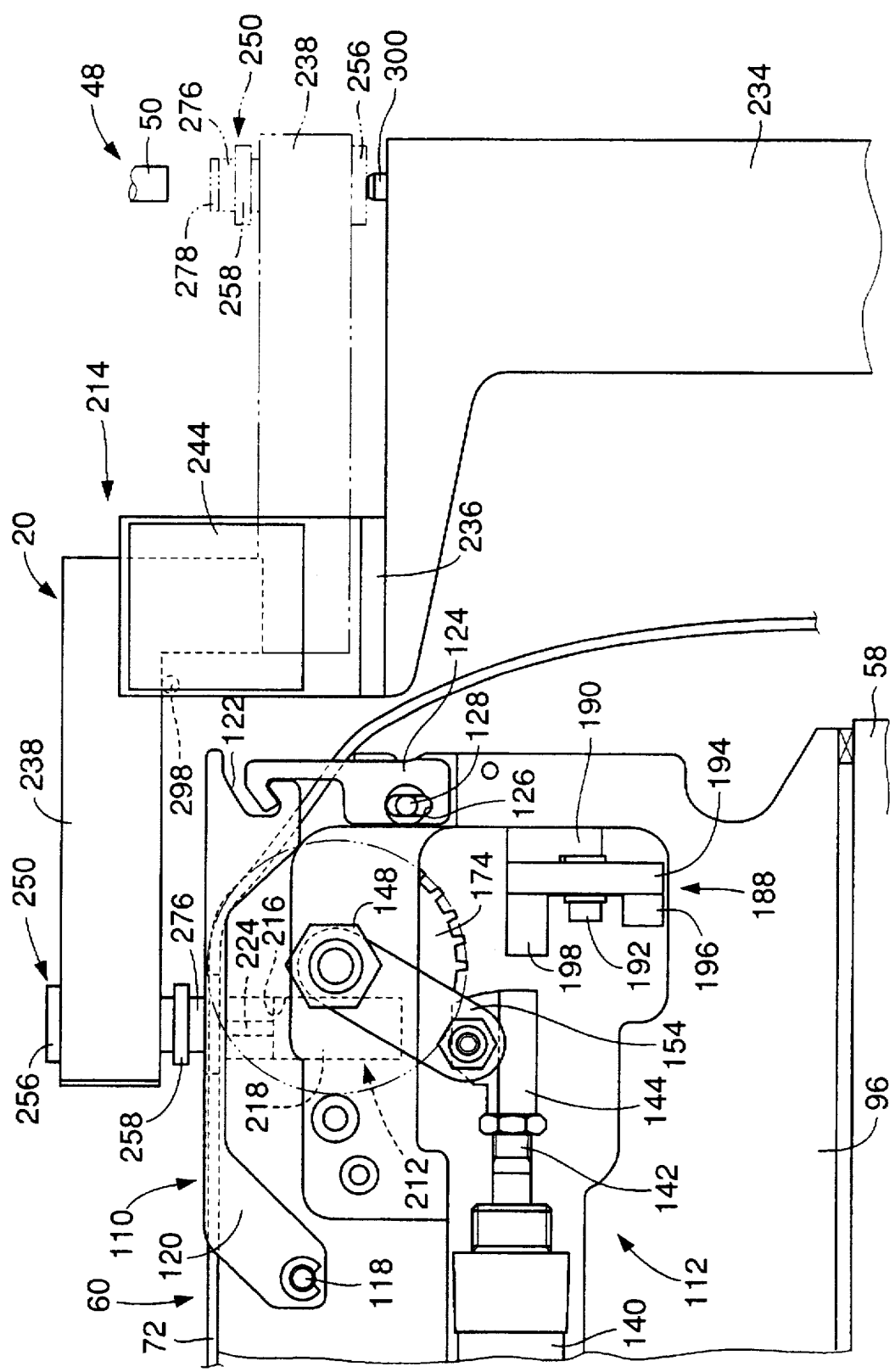
FIG. 8 is a side view of the EC removing device of FIG. 1.

As shown in FIG. 7, the EC removing device 20 of each supplying cartridge 60 includes a thrust-up device 212 which is provided on one side of the adhesive tapes 78 opposite to the other side thereof on which the electronic components 70 are held. As shown in FIG. 8, the EC removing device 20 also includes a hand-over device 214 which is provided adjacent to the EC removing position, between the EC supplying device 16 and the EC mounting device 18.

The thrust-up device 212 includes a thrust-up air cylinder 218 which is accommodated in a hole 216 formed at a location corresponding to the EC supplying position. The air cylinder 218 is fixed with a bolt (not shown). The hole 216 opens upward. The air cylinder 218 includes a cylinder housing 222 and a piston rod 220 projecting upward from the housing 222. A disc-like thrust-up member 224 having a diameter greater than that of the piston rod 220, is fixed to a top end of the piston rod 220.

When air is supplied to an air chamber 228 provided below a piston 226, the thrust-up member 224 is moved upward, so that the thrust-up member 224 goes through the opening 86 between the two adhesive tapes 78 and contacts the electronic component 70. Eventually, a top end of the thrust-up member 224 is moved to a thrust-up position above the adhesion surfaces 88 of the adhesive tapes 78. When the air chamber 228 is communicated with the atmosphere, the piston 226 is biased by a spring 230, the thrust-up member 224 is moved downward to a retracted position below lower surfaces 232 of the adhesive tapes 78.

Figure 10:
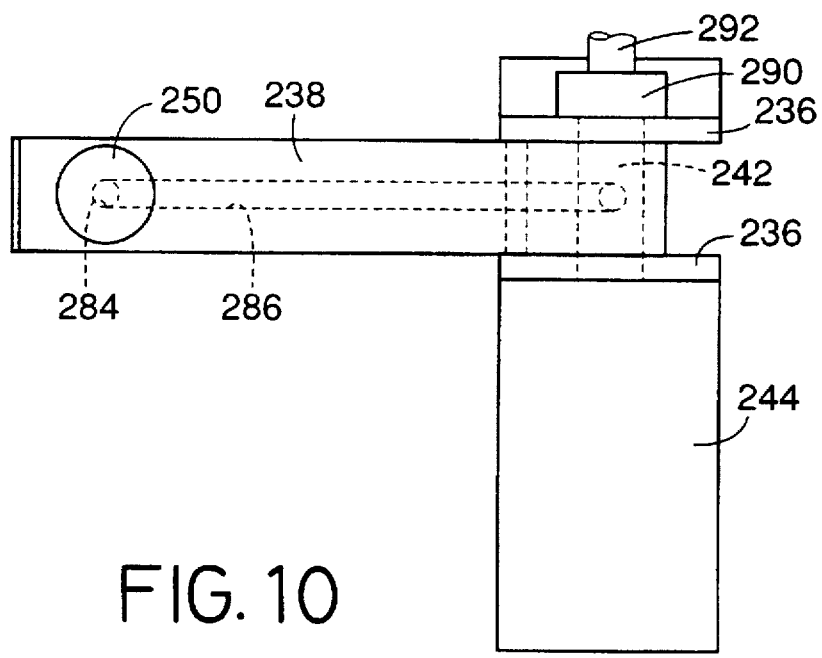
FIG. 10 is a plan view of the hand-over device of FIG. 9.
Figure 11:
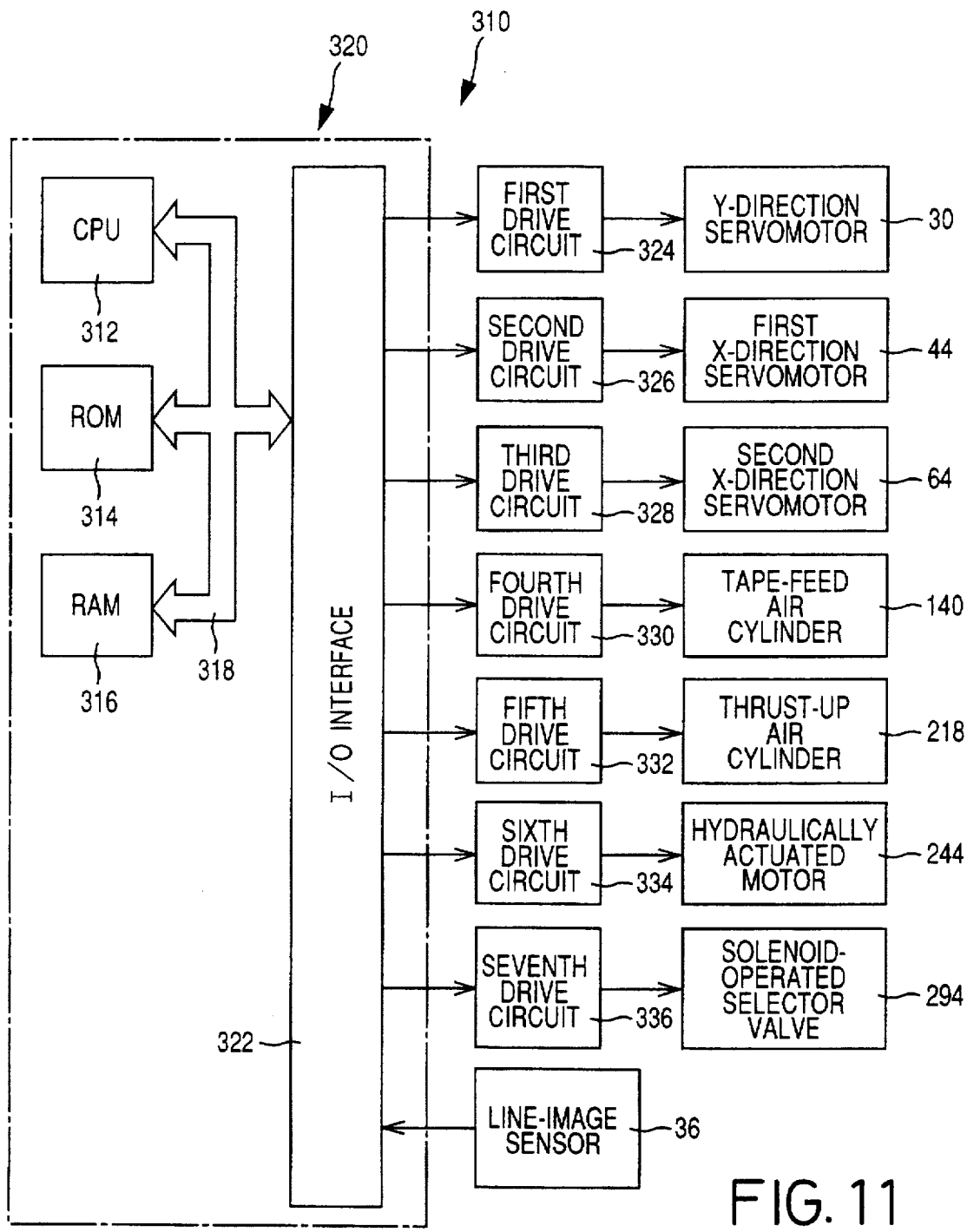
FIG. 11 is a diagrammatic view of a pertinent portion of a control device which controls the mounting system of FIG. 1.

As shown in FIG. 8, the hand-over device 214 is provided on a bed 234 provided on the base 10, between the EC supplying device 16 and the EC mounting device 18. A pair of brackets 236 are fixed to an upper surface of the bed 234. A rotatable arm 238 is supported by the two brackets 236 such that the arm 238 is rotatable about an axis line perpendicular to the length-wise direction of the adhesive tapes 78 and parallel to the adhesion surfaces 88 of the tapes 78. As shown in FIG. 10, opposite end portions of an axis member 242 fixed to the arm 238 are rotatably supported by the two brackets 236, respectively, and the axis member 242 is rotated by 180 degrees by a hydraulically actuated motor 244. The directions of rotation of the motor 244 are switched via a solenoid-operated selector valve (not shown) under control of a control device 310 (FIG. 11). Thus, the arm 238 is rotatable over 180 degrees.

Figure 9:
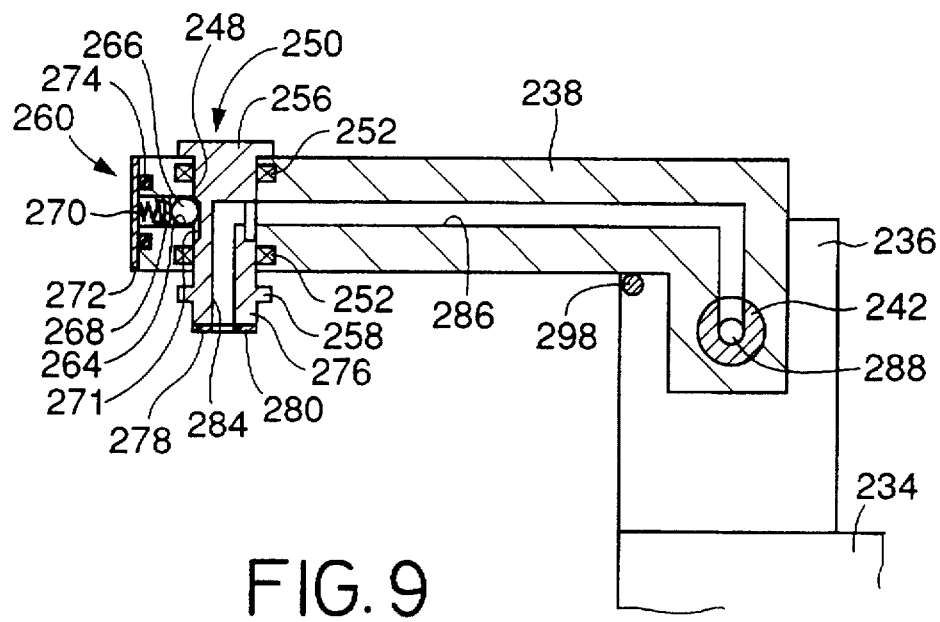
FIG. 9 is a longitudinal cross-section view of a hand-over device of the EC removing device of FIG. 1.

As shown in FIGS. 9 and 10, a through-hole 248 having a circular cross section is formed through the thickness of a free end portion of the rotatable arm 238. The through-hole 248 extends in a plane perpendicular to the axis member 242 about which the arm 238 is rotated. An EC suction nozzle 250 is airtightly received in the throughhole 248 via two sealing members 252, 252, such that the suction nozzle 250 is movable in an axial direction thereof. The seal members 252 are provided by mechanical seals which contribute to reducing the friction produced when the suction nozzle 250 is moved relative to the arm 238. Axially opposite end portions of the suction nozzle 250 project out of the rotatable arm 238, and provide a large-diameter head portion 256 and an annular flange 258, respectively. Thus, the suction nozzle 250 is prevented from coming off the arm 238.

The rotatable arm 238 is provided with a suction-nozzle supporting device 260 which can stop and hold the suction nozzle 250 at any position in the axial direction thereof relative to the arm 238. A ball 266 is provided in a through-hole 264 which extends perpendicularly to the through-hole 248 and opens in the hole 248 and in an end face of the free end portion of the arm 238. The ball 266 is biased by a spring 270 via a spring seat 268, and is engaged with an engagement groove 271 formed in an outer circumferential surface of the suction nozzle 250. Thus, the suction nozzle 250 is inhibited from being rotated, and is pressed, in a direction away from the suction-nozzle supporting device 260, against an inner cylindrical surface of the arm 238 which defines the through-hole 248. Owing to the friction force produced between the nozzle 250 and the arm 238, the friction force produced between the ball 266 and the nozzle 250, and the friction force produced between the ball 266 and the seat 268, the arm 238 can stop and hold the nozzle 250 even if the nozzle 250 may take any position in the axial direction thereof relative to the arm 238. The opening of the through-hole 264 in the end surface of the arm 238 is airtightly closed by a cover member 272 via a seal member 274.

When the suction nozzle 250 attracts each electronic component 70 by air suction, the nozzle 250 takes a position in which the flange 258 is lower than the head portion 256. A cushion member 278 formed of a urethane rubber is fixed to an end face of a suction projection 276 which projects from the flange 258. The cushion member 278 has a contact surface 280 which contacts the upper surface of each component 70 provided with the solder bumps 76.

A passage 284 is formed in the suction nozzle 250, such that the passage 284 opens in the suction surface 280 and the outer circumferential surface of the nozzle 250. The passage 284 communicates with a passage 286 formed in the rotatable arm 238. The opening of the passage 284 in the outer circumferential surface of the nozzle 250 is elongate in the axial direction of the nozzle 250. Thus, the air communication between the passages 284, 286 is maintained even if the suction nozzle 250 may be moved in the axial direction thereof.

The passage 286 is connected to a vacuum source (not shown) via a passage 288 formed in the axis member 242, a coupling 290, a hose 292, and a solenoid-operated selector valve 294 (FIG. 11). A vacuum or negative pressure is supplied to, and the supply is cut from, the passage 284 depending upon a selected operation mode of the solenoid valve 294.

As shown in FIG. 8, as the axis member 242 is rotated by the hydraulically actuated motor 244, the rotatable arm 238 is rotated between the EC removing position indicated at solid line and an EC handing-over position indicated at two-dot chain line. At the EC removing position, the suction nozzle 250 is opposed to the thrust-up member 224 with the component 70 being positioned therebetween. At the EC handing-over position away from the EC removing position over 180 degrees, the suction nozzle 250 is opposed to the suction head 48 of the EC mounting device 18, with the component 70 being positioned therebetween.

As shown in FIG. 9, the limit of rotation of the arm 238 toward the EC removing position is defined by a stopper member 298 on which the arm 298 is abutable. With the arm 238 being held at the EC removing position, the suction nozzle 250 takes a vertical posture in which the passage 284 opens downward. The suction nozzle 250 has dimensions which ensure that with the arm 238 being held at the EC removing position, the contact surface 280 is positioned slightly above the solder bumps 76 of the component 70. With the arm 238 being held at the EC removing position, the suction nozzle 250 and the adhesive tapes 78 are located on both sides of the component 70, respectively. Meanwhile, as shown in FIG. 8, the limit of rotation of the arm 238 toward the EC handing-over position is defined by a stopper member 300, provided on the bed 234, on which the arm 298 is abutable via the head portion 256 of the nozzle 250. With the arm 238 being held at the EC holding-over position, the nozzle 250 takes a vertical posture in which, however, the passage 284 opens upward.

The present EC mounting system is controlled by a control device 310 shown in FIG. 11. The control device 310 is essentially provided by a computer 320 including a central processing unit (CPU) 312, a read only memory (ROM) 314, a random access memory (RAM) 316, and bus 318 which connects between the elements 312, 314, 316 and connects the same 312, 314, 316 to an input and output (I/O) interface 322. The line-image sensor 36 is also connected to the I/O interface 322. In addition, the Y-direction servomotor 30, first and second X-direction servomotors 44, 64, tape-feed air cylinder 140, thrust-up air cylinder 218, hydraulically actuated motor 244, and solenoid-operated selector valve 294 are connected to the I/O interface 322 via first to seventh drive circuits 324, 326, 328, 330, 332, 334, 336, respectively.

Next, there will be described the operation of the EC mounting system constructed as described above.

When each electronic component ("EC") 70 is mounted on the PCB 24, the EC removing device 20 removes the EC 70 from the adhesive tapes 78 and hands over the EC 70 to the EC mounting device 18, so that the EC mounting device 18 mounts the EC 70 on the PCB 24. When the EC supplying device 16 operates for moving one of the EC supplying cartridges 60 to the EC removing position, the rotatable arm 238 of the hand-over device 214 is held at the EC handing-over position. After one of the cartridges 60 is positioned at the EC removing position, the arm 238 is rotated to the EC removing position. After this rotation, the operating mode of the solenoid valve 294 is changed to another, so that a negative pressure is supplied to the suction nozzle 250.

Figure 12:
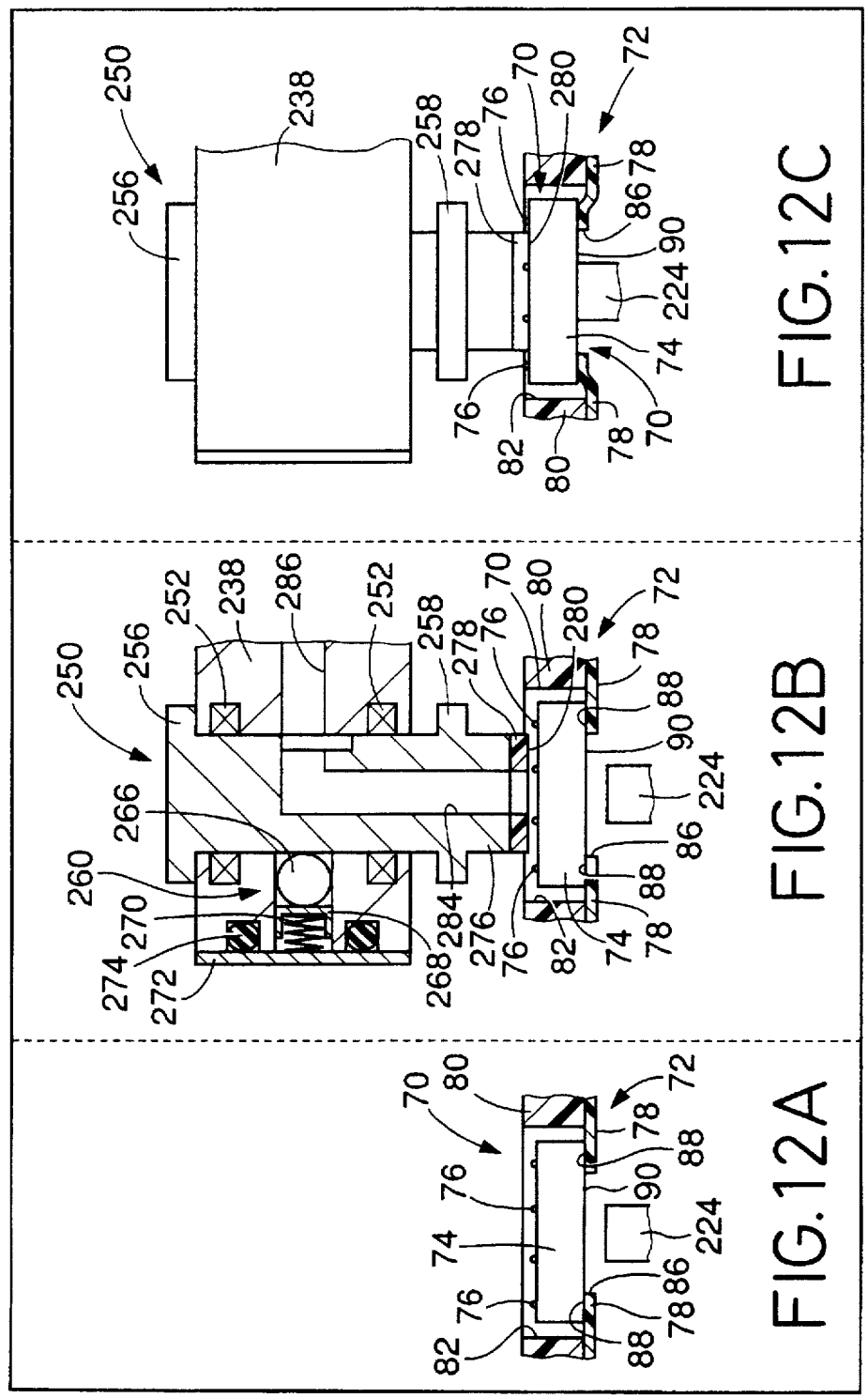
FIG. 12A is a view showing a first step carried out by the EC removing device of FIG. 1 for removing an EC from the carrier tape.
FIG. 12B is a view showing a second step carried out by the EC removing device of FIG. 1 for removing the EC from the carrier tape.
FIG. 12C is a view showing a third step carried out by the EC removing device of FIG. 1 for removing the EC from the carrier tape.
Figure 13:
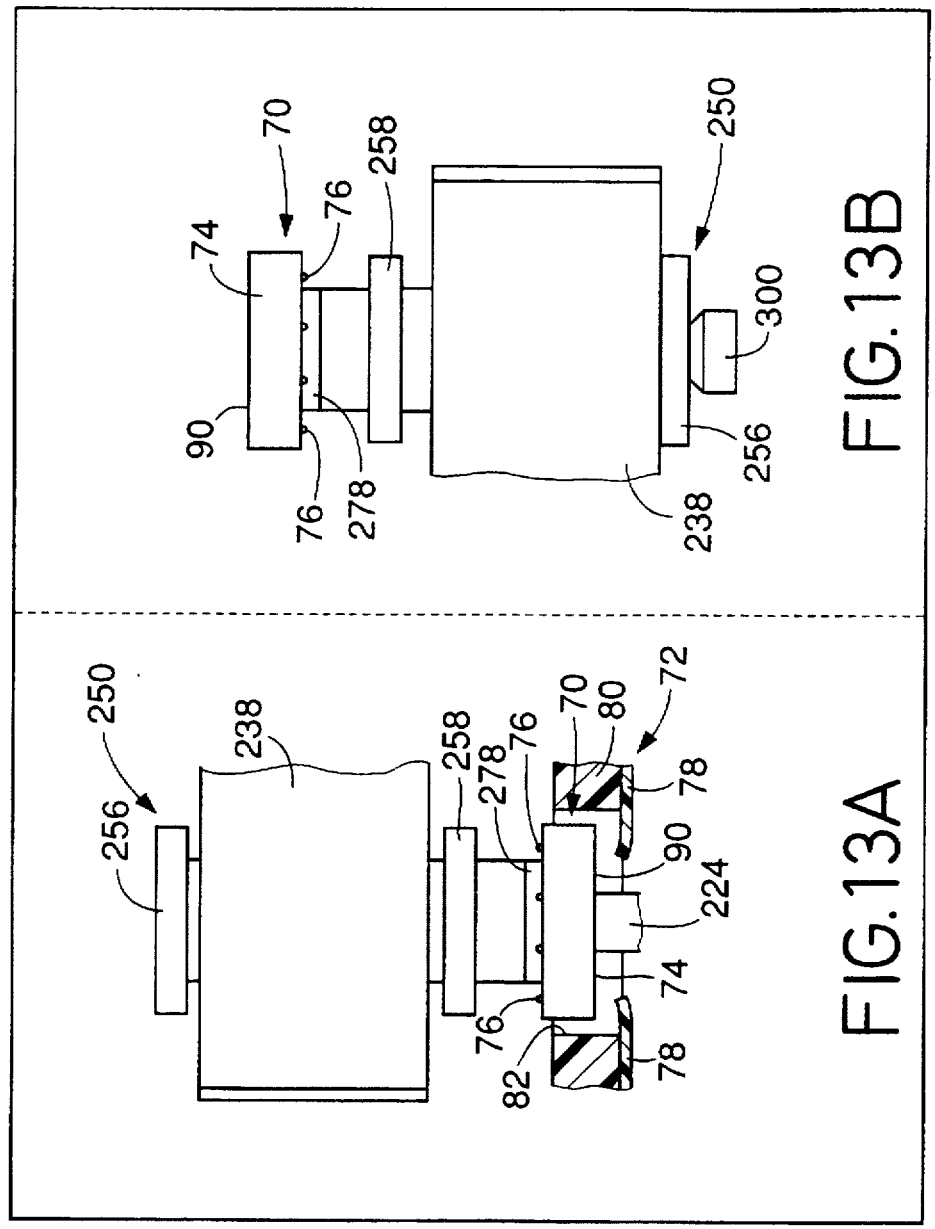
FIG. 13A is a view showing a fourth step carried out by the EC removing device of FIG. 1 for removing the EC from the carrier tape.
FIG. 13B is a view showing a fifth step carried out by the EC removing device of FIG. 1 for removing the EC from the carrier tape.

FIG. 12A shows the thrust-up member 224 of the thrust-up device 212 being held at the retracted position thereof in the supplying cartridge 60. After one of the cartridges 60 is positioned at the EC removing position, the arm 238 is rotated to the EC removing position and subsequently the thrust-up member 224 is moved upward to the thrust-up position, as shown in FIG. 12B. FIGS. 12A, 12B, 12C, and 13A show the arm 238 and the carrier tape 72 in such a manner that the two elements 238, 72 are rotated relative to each other about a vertical axis line over 90 degrees from their actual relative angular position, for easier understanding purposes only.

For removing the EC 70 from the adhesive tapes 78, the thrust-up member 224 directly contacts the lower surface 90 of the EC 70 through the spacing 86 between the two adhesive tapes 78. As shown in FIG. 12C, the thrust-up member 224 thrusts up the EC 70 so that the EC 70 contacts the contact surface 280 of the suction nozzle 250. Since the contact surface 280 is provided by the cushion member 278, the solder bumps 276 are not damaged. Thus, the EC 70 is brought into close contact with the contact surface 280, and the EC 70 is attracted by air suction to the contact surface 280. Thereafter, as the thrust-up member 224 further thrusts up the EC 70, the suction nozzle 250 is moved upward relative to the arm 238 against the resistance applied by the suction-nozzle supporting device 260, while the EC 70 is sandwiched between the thrust-up member 224 and the suction nozzle 250.

As shown in FIG. 12C, for a while just after the thrust-up member 224 begins to thrust up the EC 70, the inner portions of the adhesive tapes 78 which correspond to the accommodating hole 82 are moved upward together with the EC 70, because the EC 70 is adhered to the inner portions. However, since the cover member 110 covers the carrier tape 72 and is biased by the spring 130 to contact the upper surface of the spacer tape 80, the upward movement of the adhesive tapes 78 is eventually inhibited by the cover member 110 via the spacer tape 80. Thus, as shown in FIG. 13A, the EC 80 is removed from the adhesive tapes 78 when the EC 70 is moved upward by an appropriate amount.

As previously described, the EC supplying position of each cartridge 60 is located adjacent to the position where the teeth 176 of the sprocket 174 are engaged with the tape feeding holes 84 of the spacer tape 80, on the upstream side of that position in the EC feeding direction. Accordingly, the amount of upward movement of the adhesive tapes 78 is effectively reduced and therefore the EC 70 is easily removed from the adhesive tapes 78. In addition, since the adhesive tapes 78 and the spacer tape 80 are wound on the sprocket 174 over about 45 degrees, the carrier tape 72 is biased, because of the tension thereof, toward the sprocket 174, i.e., the cartridge frame 96. Thus, in particular, the portions of the adhesive tapes 78 which are near to the sprocket 174 are effectively prevented from moving upward from the cartridge frame 96.

When the thrust-up member 224 is moved upward to the thrust-up position, the suction nozzle 250 is moved upward together with the thrust-up member 224, to a position relative to the rotatable arm 238, and is held at the moved position by the suction-nozzle supporting device 260. Since the suction nozzle 250 is securely held at the moved position by the supporting device 260, the nozzle 250 does not come off the arm 238, or move out of position relative to the arm 238, while the arm 238 is rotated from the EC removing position to the EC handing-over position after the EC 70 is thrusted up and taken up by the nozzle 250.

Since the suction nozzle 250 is held at the moved position, the EC 70 is not moved down together with the thrust-up member 224 or is not adhered to the adhesive tapes 78 again, even if the thrust-up member 224 may be moved downward from the thrust-up position to the retracted position before the rotatable arm 238 is rotated from the EC removing position to the EC handing-over position. Thus, the downward movement of the thrust-up member 224 to the retracted position and the rotation of the arm 238 to the EC handing-over position are concurrently carried out and therefore the next EC 70 is quickly fed to the EC removing position, i.e., EC supplying position. Unless the thrust-up member 224 is cleared, i.e., moved downward, out of the EC accommodating hole 82, the carrier tape 72 cannot be fed forward. Accordingly, if the downward movement of the thrust-up member 224 toward the retracted position would be started after the rotation of the arm 238 to the EC handing-over position, the feeding of the carrier tape 72 would be delayed as such. In the present embodiment, however, the movement of the thrust-up member 224 and the rotation of the arm 238 are concurrently carried out, and the next EC 70 is quickly fed to the EC removing position.

When the rotatable arm 238 is rotated up to an angular position just before the EC handing-over position, the head portion 256 of the suction nozzle 250 contacts the stopper 300. When the arm 238 is further rotated, the suction nozzle 250 is moved relative to the arm 238. Eventually, as shown in FIG. 13B, the arm 238 is held in contact with the stopper 300 via the head portion 256. Thus, the nozzle 250 is returned from the moved position to its original position which had been taken before being thrusted up by the thrust-up member 224 with the EC 70 being sandwiched therebetween at the EC removing position.

Figure 14:
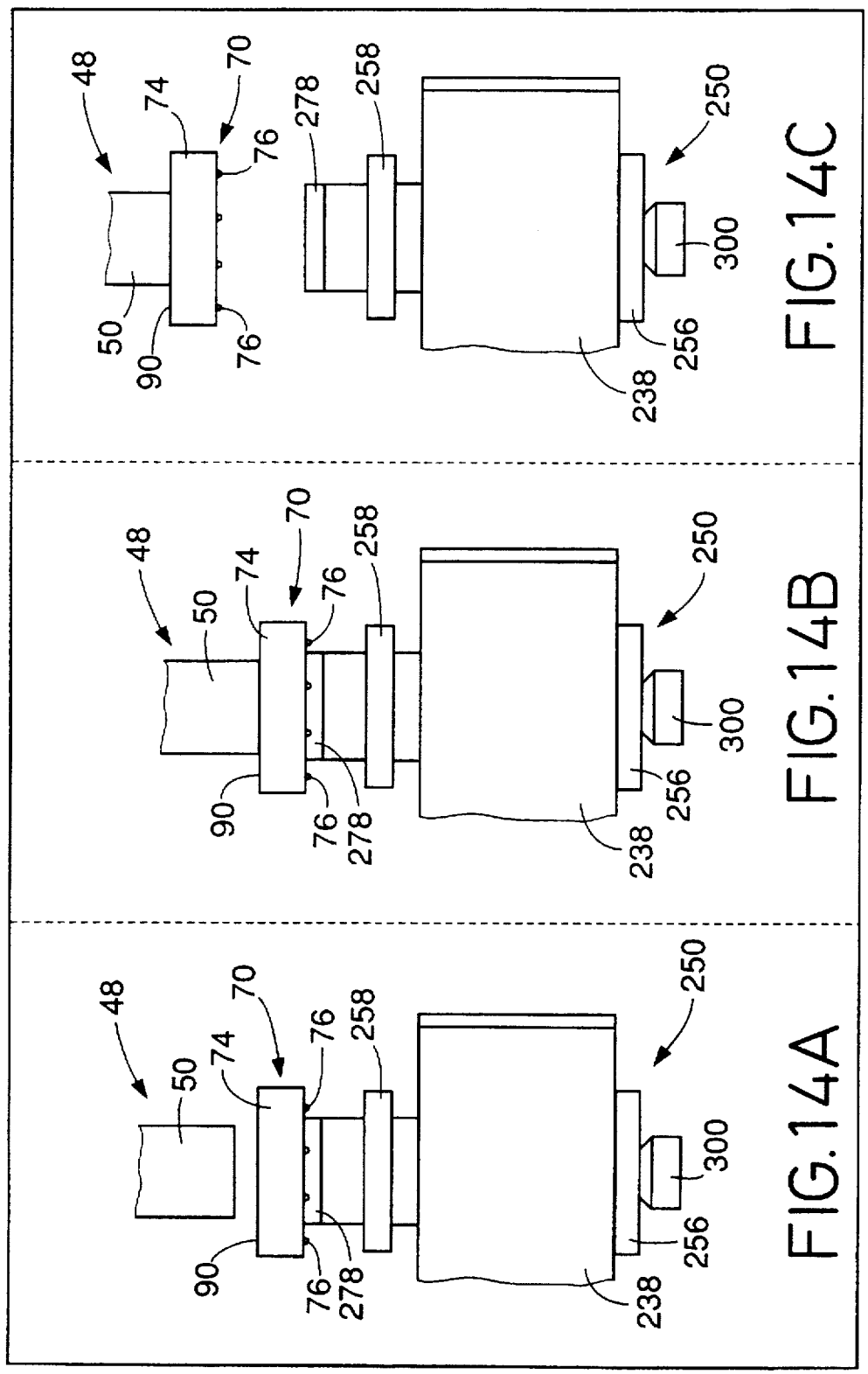
FIG. 14A is a view showing a first step carried out by the EC removing device of FIG. 1 for handing over the EC removed from the carrier tape, to an EC mounting device of FIG. 1.
FIG. 14B is a view showing a second step carried out by the EC removing device of FIG. 1 for handing over the EC to the EC mounting device of FIG. 1.
FIG. 14C is a view showing a third step carried out by the EC removing device of FIG. 1 for handing over the EC to the EC mounting device of FIG. 1.

As the rotatable arm 238 is rotated over 180 degrees to the EC handing-over position, the suction nozzle 250 is also rotated over 180 degrees, i.e., is turned upside down. Consequently the adhesion surface 90 of the EC 70 faces upward. As shown in FIG. 14A, after the rotation of the arm 238, the suction head 48 of the EC mounting device 18 is moved to the handing-over position directly above the EC 70 held by the suction nozzle 250. Subsequently, as shown in FIG. 14B, the suction head 48 is moved downward so that the suction nozzle 50 of the head 48 contacts the adhesion surface 90 of the EC 70. Since the suction nozzle 250 is held in contact with the stopper 300, the contact surface 280 of the nozzle 250 takes a constant height or level. Therefore, the suction head 48 takes up, with reliability, the EC 70 held by the nozzle 250.

After the suction nozzle 50 contacts the EC 70, a negative pressure is supplied to the nozzle 50 to attract the EC 70 by air suction. After this attraction, the supply of negative pressure to the suction nozzle 250 is stopped to permit the EC 70 to be handed over to the suction nozzle 50 of the suction head 48. Subsequently, as shown in FIG. 14C, the head 48 is moved upward and then is moved in the X direction to the PCB 24. Thus, the EC 70 is mounted on the PCB 24.

As is apparent from the foregoing description, the present EC mounting system supplies the ECs 70 each of which has the solder bumps 76 on one surface thereof, to the PCB 24, without damaging the solder bumps 76, and mounts the ECs 70 on the PCB 24. While the rotatable arm 238 is rotated from the EC removing position to the EC handing-over position, the contact surface 280 of the suction nozzle 250 continues to contact the solder bumps 76 of each EC 70.

Since, however, the contact surface 280 is provided by the cushion member 278, each EC 70 is not damaged.

In addition, when the rotatable arm 238 is rotated to the EC handing-over position, the suction nozzle 250 is brought into abutment with the stopper 300 and accordingly the rotation of the arm 238 is stopped. Thus, the limit of rotation of the arm 238 is defined by the stopper 300. At the same time, the nozzle 250 is returned to its original position relative to the arm 238. Thus, the stopper 300 also functions as a returning device for returning the nozzle 250 from a moved position to the original position. In this respect, the present EC mounting system enjoys a simplified construction.

In the present embodiment, the thrust-up device 212 provides a thrusting device; the suction nozzle 250 provides an electronic-component holder; the rotatable arm 238 provides a movable member; the hydraulically actuated motor 244 provides an actuator for moving the movable member; and the hand-over device 214 provides a receiving device for receiving an electronic component. The EC handing-over position of the arm 238 corresponds to a different position away from the EC removing position. The cover member 110 provides a stopper which indirectly stops the movement of the adhesive tapes 78 via the spacer tape 80 when the thrust member 224 thrusts the EC 70.

Moreover, in the present embodiment, the thrust-up position of the thrust-up device 224 is higher than the respective upper ends of the EC accommodating holes 82, and the suction nozzle 250 is held at a moved position by the suction-nozzle supporting device 260. After the thrust-up member 224 is moved upward to the thrust-up position, the rotatable arm 238 is rotated to the EC handing-over position and simultaneously the thrust-up member 224 is moved downward into the cartridge frame 96 of the supplying cartridge 60. Concurrently, if necessary, the current cartridge 60 may be moved out of the EC removing position and another cartridge 60 may be moved to the same position. Thus, an overall time needed to mount the ECs 70 on the PCB 24 may be reduced.

Figure 15:
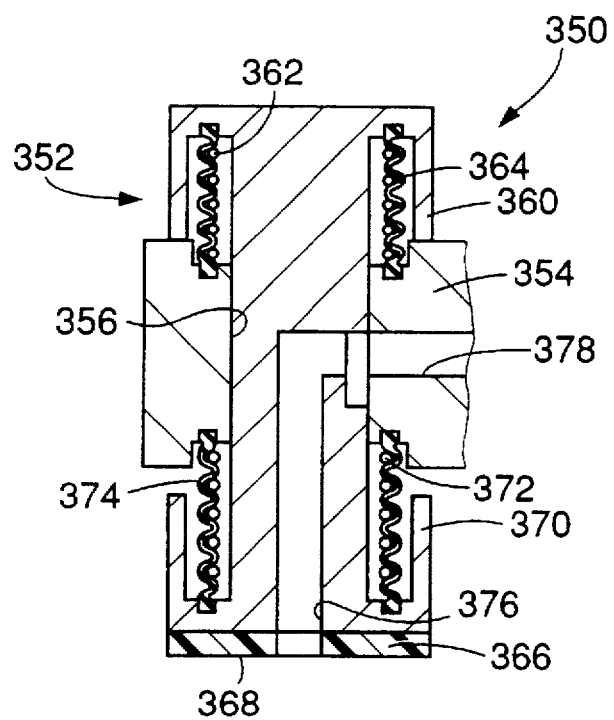
FIG. 15 is a longitudinal cross-section view of an EC suction nozzle of an EC hand-over device of an EC removing device as a second embodiment of the present invention.

FIG. 15 shows a second embodiment of the present invention which has a construction similar to the first embodiment shown in FIGS. 1 to 14 and is different from the first embodiment only in that a hand-over device 350 is employed in place of the hand-over device 214 shown in FIGS. 8, 9, and 10. The hand-over device 350 includes a biasing member for balancing the weight of a suction nozzle 352, and a pair of bellows 364 in place of the seal members 252. In the second embodiment, the load applied to an EC 70 when the nozzle 352 contacts the EC 70 is reduced. The other parts or elements of the second embodiment are the same as the corresponding parts or elements of the first embodiment, and the description and illustration thereof are omitted.

The suction nozzle 352 extends through a through-hole 356 formed through the thickness of a free end portion of a rotatable arm 354, such that the nozzle 352 is movable relative to the arm 354. A first compression coil spring 362 (hereinafter, referred to as the "first spring" 362) as an example of an elastic member functioning as the above-indicated biasing member, is provided between the arm 354 and a bottom wall of a first cylindrical spring seat 360 provided at one of axially opposite end portions of the nozzle 352. The first spring 362 is covered with bellows 364 formed of rubber.

A cushion member 366 is fixed to an outer surface of the other end portions of the suction nozzle 352 that faces downward when the rotatable arm 354 is held at an EC removing position where the nozzle 352 removes by air suction each EC 70 from a carrier tape 72. The cushion member 366 provides a contact surface 368. In addition, a second cylindrical spring seat 370 with a bottom wall is provided at the other end portion of the nozzle 352. A second compression coil spring 372 (hereinafter, referred to as the "second spring" 362) as an example of an elastic member functioning as the biasing member, is provided between the arm 354 and the bottom wall of the second spring seat 370. The second spring 362 is covered with bellows 374 formed of rubber. The pair of bellows 364, 374 are provided for keeping the airtight connection between the nozzle 352 and the arm 354, and thereby preventing the invasion of dust into small gaps between the two elements 352, 354 because of negative pressure supplied through passages 376, 378.

Before the suction nozzle 352 supported by the rotatable arm 354 being held at the EC removing position removes the EC 70 from the adhesive tapes 78, the suction nozzle 352 is biased downward with the biasing force of the first spring 362 and a force corresponding to the difference between the weight of the suction nozzle 352 and the biasing force of the second spring 372. Thus, the first spring seat 360 of the nozzle 352 is held in contact with the arm 354. Since the seal members 252, 252 employed in the first embodiment are replaced by the bellows 364, 374 in the second embodiment, the frictional resistance exerted to the movement of the nozzle 352 relative to the arm 354 is negligible. Therefore, the nozzle 352 is pressed against the EC 70 with a force equal to the force with which the first spring seat 360 is pressed against the arm 354. In the second embodiment, this pressing force is smaller than the weight of the nozzle 352, though, however, the pressing force may be greater than the weight of the nozzle 352, depending upon the respective biasing forces of the first and second springs 362, 372.

When the EC 70 is thrusted up by the thrust-up member 224 further more after the EC 70 has been brought into contact with the contact surface 368 of the suction nozzle 352, the nozzle 352 is moved up, thereby permitting the EC 70 to be thrusted up. The first spring 362 is expanded and the second spring 372 is compressed. However, substantially no change is found with the respective biasing forces of the two springs 362, 372. Thus, with the prescribed pressing force the nozzle 352 is pressed on the EC 70 to attract the EC 70 by air suction. Since each of the springs 362, 372 is provided by a coil spring having a small spring constant, the biasing force of each spring 362, 372 does not change any appreciable amount when being subject to a small expansion or compression.

After the suction nozzle 352 removes the EC 70 from the adhesive tapes 78, the rotatable arm 354 is rotated over 180 degrees to the EC-handing-over position and the suction nozzle 352 is turned upside down. The nozzle 352 is moved downward because of the self weight thereof, so that the second spring seat 370 is brought into contact with the arm 354. The limit of rotation of the arm 354 to the EC-handingover position is defined by direct contact of the arm 354 with a stopper (not shown). Since the arm 354 is held in direct contact with the stopper and the second spring seat 370 is held in contact with the arm 354, the EC 70 on the contact surface 368 of the nozzle 352 is placed at a constant height at the EC-handing-over position.

When the rotatable arm 354 is rotated from the EC-handing-over position to the EC-removing position, the suction nozzle 352 is returned to its original position in which the first spring seat 360 is held in contact with the arm 354.

Figure 16:
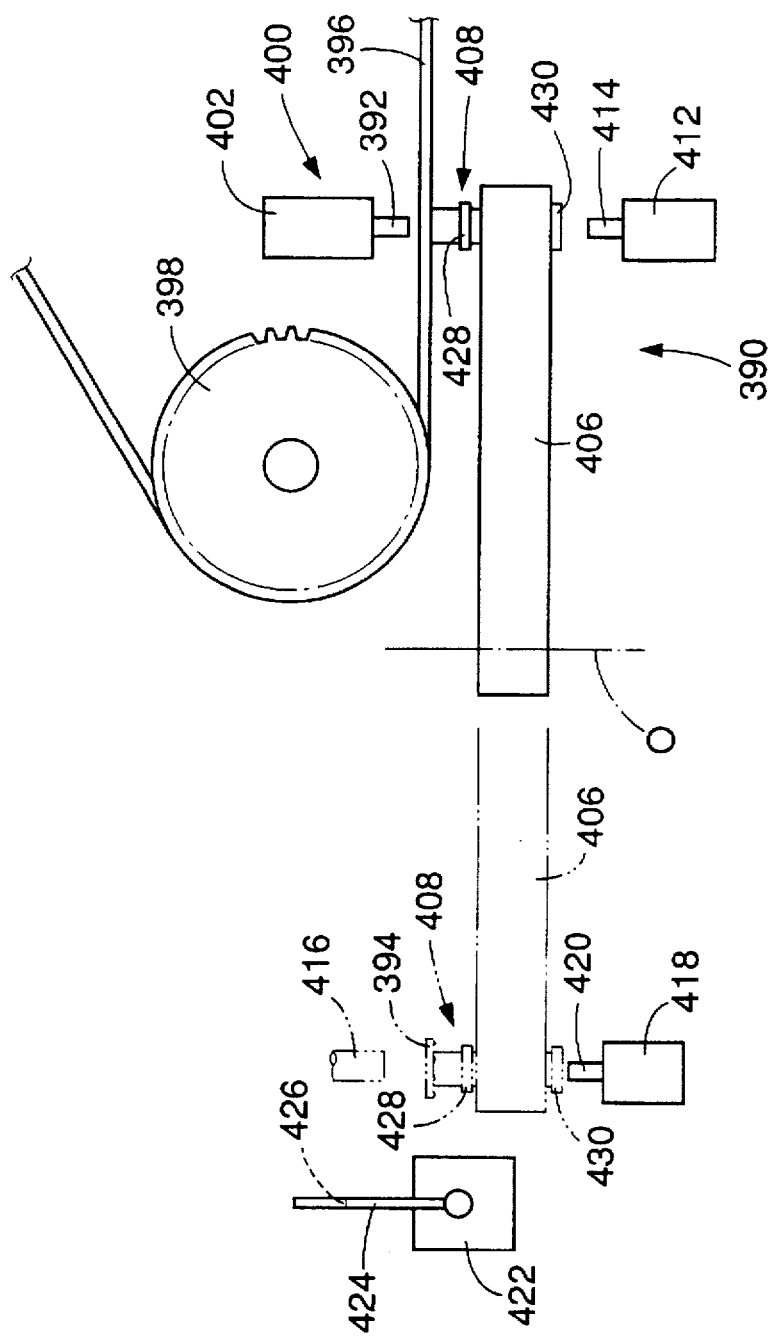
FIG. 16 is a side view of an EC removing device as a third embodiment of the present invention.

FIG. 16 shows an electronic-component removing system as a third embodiment of the present invention which has a construction similar to the first embodiment shown in FIGS. 1 to 14 and is different from the first embodiment only in that a thrust-down member 392 is employed to thrust down an electronic component ("EC") 394 to remove the EC 394 from adhesive tapes 78, in place of the thrust-up member 224 employed in the first embodiment.

A number of ECs 394 are carried on a carrier tape 396 similar to the carrier tape 72 shown in FIGS. 2–4. After the carrier tape 396 is fed out of a tape reel (not shown), the tape 396 is wound around a sprocket 398 over about half the entire circumference thereof from a lower end portion thereof to an upper end portion thereof. As the sprocket 398 is rotated intermittently, the tape 396 is fed forward at a predetermined pitch corresponding to the angle of each intermittent rotation of the sprocket 398.

The carrier tape 396 is fed in an upside-down manner, that is, in such a manner that a spacer tape thereof is adhered to lower surfaces of the adhesive tapes 78 thereof. The upper surfaces of ECs 396 are adhered to the lower surfaces of the adhesive tapes 78, and the lower surfaces of ECs 396 on which solder bumps are provided face downward. A thrust-down device 400 is provided above a tape-feeding path along which the tape 396 is fed between the tape reel and the sprocket 398, on an upstream side of the sprocket 398 in an EC feeding direction. The thrust-down member 392 is moved by a thrust-down air cylinder 402, between a retracted position above the tape-feeding path and a thrust-down position where a lower end of the thrust-down member 392 reaches a position lower than the adhesive tapes 78 of the tape 396.

A hand-over device 390 including a rotatable arm 406 is provided below the tape feeding path. The arm 406 is rotatable about a vertical axis line, O, and a suction nozzle 408 similar to the suction nozzle 250 is supported by a free end portion of the arm 406 such that the nozzle 408 is movable upward and downward along the axis line O. The nozzle 408 is held by a suction-nozzle supporting device provided inside the arm 406, at any position relative to the arm 406 in a direction parallel to a longitudinal axis of the nozzle 408. This nozzle supporting device has a construction similar to that of the suction-nozzle supporting device 260 employed in the first embodiment.

At an EC-removing position where the suction nozzle 408 is aligned with the thrust-down member 392, a thrust-up member 414 which is moved upward and downward by an air cylinder 412, is provided. Under the EC-handing-over position where the nozzle 408 is aligned with a suction head or nozzle 416 of the EC mounting system, a support member 420 which is moved upward and downward by an air cylinder 418, is provided. On a lateral side of the rotatable arm 406, an engagement member 424 which is rotated by a pneumatically actuated motor 422, is provided. The engagement member 424 has a recess 426 for the purpose of preventing the interference with an EC-suction portion of the suction nozzle 408, and is engageable with a flange 428 of the nozzle 408.

When the rotatable arm 406 is rotated to the EC-removing position as indicated at solid line in FIG. 16, the suction nozzle 408 is at an initial position thereof in which the flange 428 of the nozzle 408 is in contact with the upper surface of the arm 406. Accordingly, the arm 406 can be rotated to the EC-removing position, while the nozzle 408 does not interfere with the carrier tape 396. Following this rotation, the thrust-up member 414 is moved upward and the nozzle 408 is moved upward till a head portion 430 of the nozzle 408 is brought into contact with the lower surface of the arm 406. In this state, a top end of the nozzle 408 is positioned in an EC accommodating hole 82 of the carrier tape 396, and a contact surface of the nozzle 408 is positioned slightly below an EC 394 accommodated in the hole 82. After the thrust-up member 414 is moved downward, the thrust-down member 392 is moved downward, cooperates with the member 414 to sandwich the EC 394, and further is moved downward with the member 414 with the EC 394 being sandwiched therebetween.

Subsequently, the thrust-down member 392 is moved upward, and the rotatable arm 406 is rotated to the EC-handing-over position. Then, the support member 420 is moved upward to move the suction nozzle 408 upward, while simultaneously supporting the same 408, till the head portion 430 of the nozzle 408 contacts the lower surface of the arm 406. Subsequently, the suction nozzle 416 is moved downward to attract the EC 394 by air suction, and then is moved upward to a retracted position. Thereafter, the support member 420 is moved downward. Then, the engagement member 424 is rotated to engage the flange 428 of the nozzle 408 and move the nozzle 408 downward to the initial position where the flange 428 contacts the upper surface of the arm 406. Subsequently, the engagement member 424 is rotated back away from the flange portion 428, and the arm 406 is rotated to the EC-removing position.

In each of the first to third embodiments, the carrier tape 72, 396 is employed which includes the two adhesive tapes 78 to which the opposite end portions of each EC 70, 394 are adhered, and additionally includes the spacer tape 80 for protecting the ECs 70, 394. However, it is possible to omit the spacer tape 80. In the latter case, it is preferred to employ, in place of the spacer tape 80, a support member which supports, when each EC 70, 394 is removed from the adhesive tapes 78, the tapes 78 on one side of the tapes 78 opposite to the other side thereof on which the thrust member 224, 392 thrusts each EC 70, 394. For example, it is possible to provide, on a movable member, a support member which is movable upward and downward independently of the suction nozzle 50, 416 and which contacts each of EC-free portions of the adhesive tapes 78 and thereby supports the tapes 78. Alternatively, it is possible to provide, on each of the EC supplying cartridges 60, a support member which contacts each of EC-free portions of the adhesive tapes 78 and thereby supports the tapes 78.

Next, there will be described a fourth embodiment of the present invention by reference to FIGS. 17 through 24.

Figure 17:
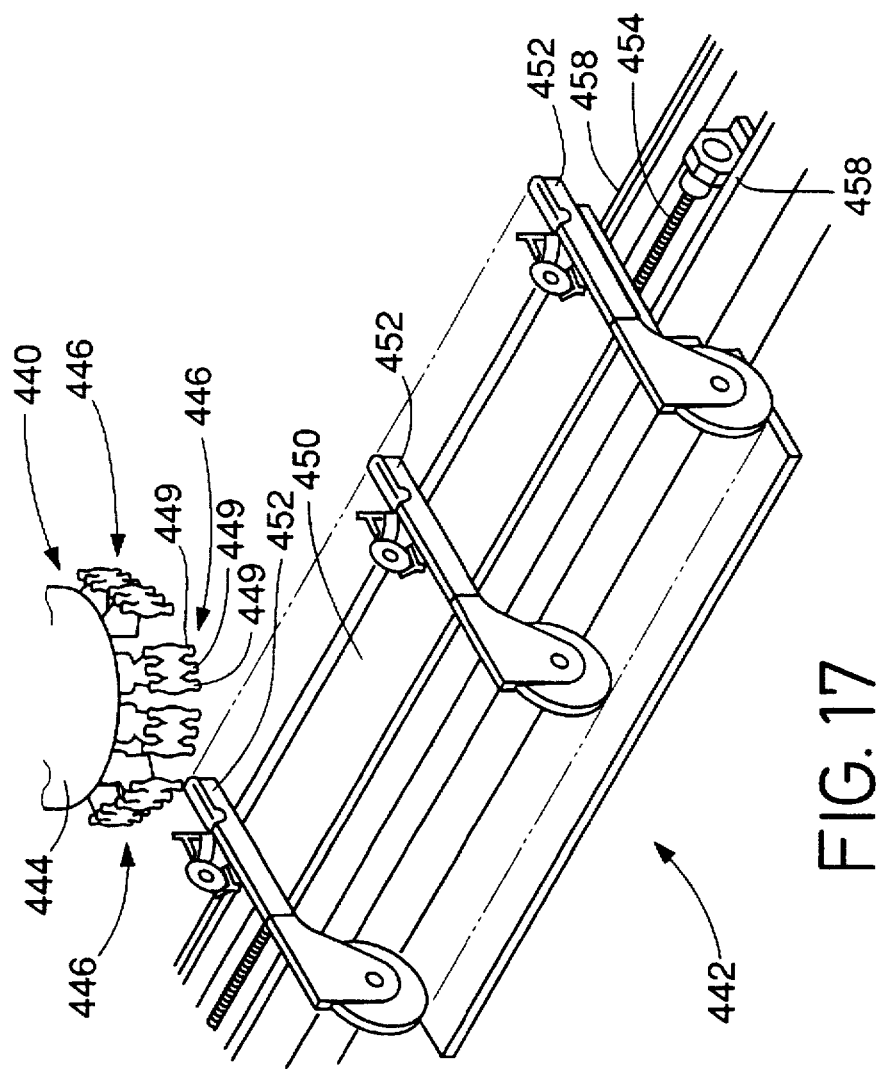
FIG. 17 is a perspective view of an EC mounting system including an EC removing device as a fourth embodiment of the present invention.

In FIG. 17, reference numeral 440 designates an electronic-component ("EC") mounting device and reference numeral 442 designates an EC supplying device. The EC mounting device 440 is the same as that disclosed in Japanese Patent Application laid open for inspection purposes under Publication No. 4(1992)-345097, and is described below in short.

As shown in FIG. 17, the EC mounting device 440 includes an index table 444 which is supported by a base plate (not shown) such that the table 444 is intermittently rotatable about a vertical axis line. The index table 444 supports twelve EC-suction units 446, and is intermittently rotated by an intermittent-rotation drive device provided by a cam, a cam follower, a rotation-axis member (all not shown), and an index servomotor 448 (FIG. 24) for rotating the cam, so that each of the twelve units 446 is sequentially moved to an EC picking-up position, an EC 90-degree rotating position, an EC-posture detecting position, an EC discarding position, an EC-posture correcting position, an EC mounting position, a nozzle identifying position, and a nozzle selecting position.

Each of the EC-suction units 446 supports three EC-suction nozzles 449, and a selected one of the nozzles 449 is used to mount an EC 460 (FIG. 18) on a printed circuit board ("PCB", not shown). Each unit 446 includes a unit frame (not shown) to which a roller (not shown) as a cam follower is attached. The roller is engaged with a curved cam groove of a cylindrical cam attached to the base plate. As the index table 444 is rotated, the roller is moved in the curved cam groove, so that each unit 446 is moved up and down while being rotated with the table 444. When each unit 446 is rotated to the EC picking-up position where the selected nozzle 449 picks up the EC 460 from the EC supplying device 442, the unit 446 is moved up to an uppermost position thereof; and when being rotated to the EC mounting position where the nozzle 449 mounts the EC 460 on the PCB, the unit 446 is moved down to a lowermost position thereof.

The EC supplying device 442 includes an X table 450 which is movable in an X direction in a horizontal plane, and a number of EC supplying cartridges 452 supported on the X table. The X table 450 is moved along guide rails 458 when a ball screw 454 is rotated by an X-direction servomotor 456 (FIG. 24), so that a selected one of the cartridges 452 is moved to the EC picking-up position of the EC mounting device 440.

Figure 18:
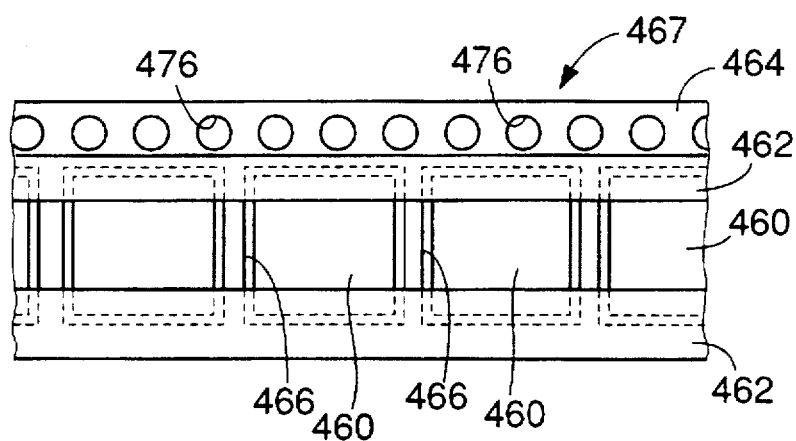
FIG. 18 is a plan view of an EC carrier tape which is supplied by an EC supplying device of the mounting system of FIG. 17.
Figure 19:
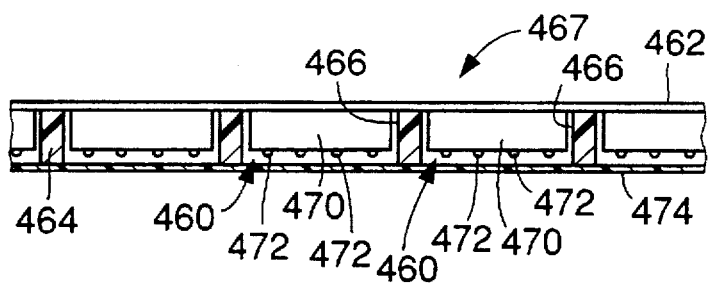
FIG. 19 is a longitudinal cross-section view of the carrier tape of FIG. 18.
Figure 20:
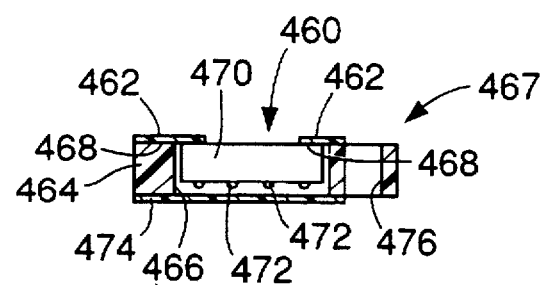
FIG. 20 is a transverse cross-section view of the carrier tape of FIG. 18.

Each of the EC supplying cartridges 452 supplies the ECs 460 carried by a carrier tape 467 shown in FIGS. 18 through 20. The carrier tape 467 includes a pair of elongate adhesive tapes 462 to which the ECs 460 are adhered, and a spacer tape 464 having a number of EC accommodating holes 466 in which the ECs 460 are accommodated. The two adhesive tapes 462 are adhered to the upper surface of the spacer tape 464 such that inner portions thereof partially cover the upper openings of the EC accommodating holes 466 and such that the two adhesive tapes 462 are spaced from each other in a direction perpendicular to a lengthwise direction thereof. Each EC 460 is a semiconductor chip 470 which is provided with solder bumps 472 on one of opposite major surfaces thereof. The other, bump-free surface of each chip 470 is adhered to respective adhesion surfaces 468 of the inner portions of the two adhesive tapes 462. Thus, each EC 460 is supplied in such a way that the solder bumps 472 are provided on the lower surface of the EC 460. A bottom tape 474 is adhered to the lower surface of the spacer tape 464, to cover the lower openings of the EC accommodating holes 466, thereby preventing foreign things from contacting the solder bumps 472. Reference numerals 476 designate tape feeding holes which will be described later.

Each EC supplying cartridge 452 includes a cartridge frame 480 having a shape like an elongate and thin box, and stands such that the length-wise and thickness-wise directions thereof are horizontal and the width-wise direction thereof is vertical. The carrier tape 467 is placed on an upper surface of the cartridge frame 480 and is fed forward under a cover member 482, by a tape supporting and feeding device 484 (hereinafter, referred to as the "tape feeder" 484). The tape feeder 484 intermittently feeds the carrier tape 467 in an EC feeding direction parallel to a Y direction perpendicular to the X direction, by a predetermined feeding pitch equal to the distance of respective centers of each pair of adjacent accommodating holes 466 of the spacer tape 464. Thus, the leading one of the ECs 460 is moved to an EC supplying position of each cartridge 452.

As shown in FIG. 21, the tape feeder 484 includes a sprocket 490, a ratchet wheel 492, and a rotary plate 494. The sprocket 490 is supported by the cartridge frame 480 such that the sprocket 490 is rotatable about an axis member 488 which extends along a horizontal axis line perpendicular to the EC feeding direction. The ratchet wheel 492 is provided as a member integral with the sprocket 490. The rotary plate 494 is supported by the axis member 488 such that the rotary plate 494 is rotatable about the axis member 488. Teeth 496 of the sprocket 490 are engaged with the tape feeding holes 476 of the carrier tape 467. A ratchet pawl 498 is rotatably attached to the rotary plate 494, and a spring (not shown) biases the ratchet pawl 498 in a direction in which the pawl 498 is engaged with one of teeth 500 of the ratchet wheel 492. A stopper lever 504 which is rotatably attached to the cartridge frame 480 and is biased by a spring 502, is engaged with another of the teeth 500 of the ratchet wheel 492. The EC supplying position is located adjacent to a position where the teeth 496 of the sprocket 490 are engaged with the tape feeding holes 476 of the spacer tape 464, on the upstream side of that position as seen in the EC feeding direction. The spacer tape 464 is wound on, or engaged with, the teeth 496 of the sprocket 490 over about 45 degrees as shown in FIG. 21.

One end portion of a tape drive plate 510 is rotatably connected via an axis member 512 to the rotary plate 494, and the other end portion of the drive plate 510 is rotatably connected via an axis member 516 to a drive lever 514. The drive lever 514 is rotatably attached via an axis member 520 to a bracket 518 fixed to the cartridge frame 480. A spring 522 is provided between a lower end portion of the drive lever 514 and the cartridge frame 480 to bias the lower end portion in the EC feeding direction.

The cover member 482 is connected via a cover drive member 524 to the drive lever 514. As the drive lever 514 is rotated, the cover member 482 is moved forward to an advanced position thereof where the cover member 482 partially covers the leading EC 460 fed to the EC supplying position, and moved backward to a retracted position thereof away from the advanced position. The cover member 482 covers the upper surface of the cartridge frame 480, and is pressed by a cover presser 530 which is biased by a spring (not shown). The cover member 482 continues to contact the adhesive tapes 462 of the carrier tape 467 till the adhesive tapes 462 are peeled off the spacer tape 464, and contacts the upper surface of the spacer tape 464 after the adhesive tapes 462 are peeled off.

Figure 22:
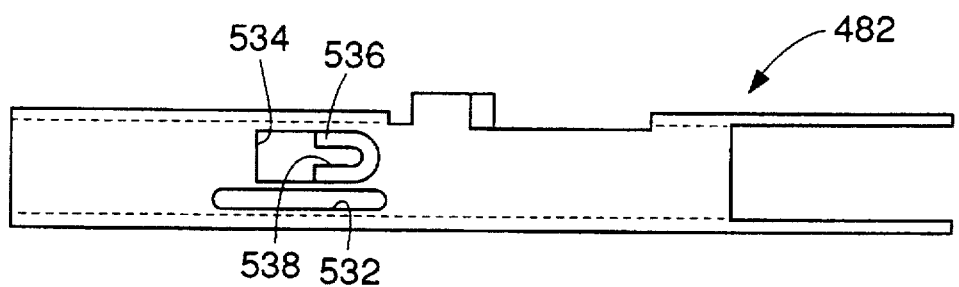
FIG. 22 is a plan view of a cover member which covers the upper surface of a cartridge frame of the supplying cartridge of FIG. 21.

As shown in FIG. 22, an elongate hole 532 is formed through the thickness of a portion of the cover member 482 which corresponds to the teeth 496 of the sprocket 490. Thus, the cover member 482 does not interfere with the engagement of the teeth 496 with the tape feeding holes 476 of the spacer tape 464. A rectangular opening 534 is also formed through the thickness of the cover member 482. Through the opening 534, each EC 460 is picked up by air suction by an EC-suction head or nozzle 449. A thin tongue member 536 is provided in an upstream-side portion of the opening 534 as seen in the EC feeding direction, and has a notch 538 opening in a downstream-side end thereof. The width of the notch 538, i.e., dimension as measured in a direction perpendicular to the EC feeding direction is slightly smaller than the spacing or distance between the two adhesive tapes 462 and is larger than the diameter of the suction nozzle 449.

The pair of adhesive tapes 462 peeled off the spacer tape 464 are drawn out through the opening 534, and folded back over about 180 degrees at the two downstream-side ends of the tongue member 536. Subsequently, as shown in FIG. 21, the adhesive tapes 462 are guided by a guide roller 544, a fixed roller 546, and a movable roller 548, and eventually taken up by a take-up reel 552 of a take-up device 550. The guide roller 544 is rotatably attached to the cartridge frame 480. The fixed roller 546 is attached to the bracket 518. The movable roller 548 is attached to the drive lever 514 and is movable with the same 514. The guide roller 544 is provided at a position where the roller 544 guides the adhesive tapes 462 along a path substantially parallel to the cover member 482.

The take-up device 550 takes up the adhesive tapes 462 when a take-up lever 554 is rotated. The take-up lever 554 is rotatably attached to an axis member 558 fixed to the bracket 518, and is biased by a spring 560 in a direction in which the take-up lever 554 contacts the drive lever 514.

Figure 23:
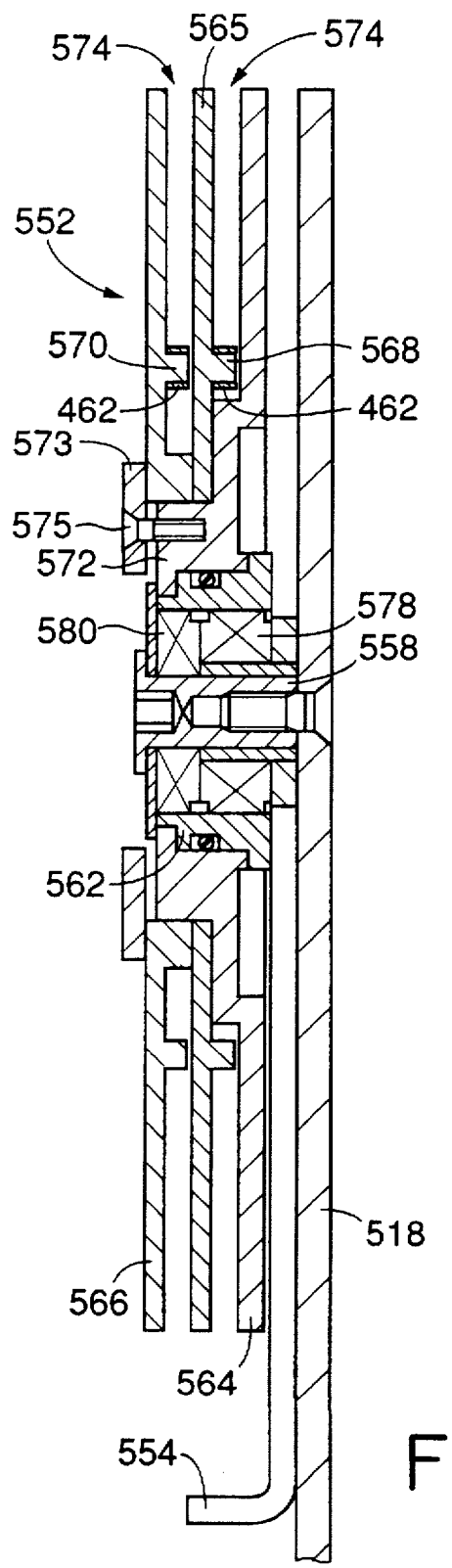
FIG. 23 is a cross-section view of a take-up reel of a take-up device of the supplying cartridge of FIG. 21.

As shown in FIG. 23, the take-up reel 552 is supported by a cylindrical support member 562 which is rotatably attached to the axis member 558. The take-up reel 552 has a generally disc-like configuration, and includes a base member 564, an intermediate plate 565, and a reel cover 566. The base member 564 is supported by the support member 562. The intermediate plate 565 is engaged with an engagement portion 572 of the base member 564. The intermediate plate 565 and the reel cover 566 have cylindrical portions 568, 570 having an equal diameter, respectively. Each of the cylindrical portions 568, 570 has a slit (not shown) which is formed through the thickness thereof so as to extend in a radial direction thereof.

One of the two adhesive tapes 462 is wound around the outer surface of one 568 of the cylindrical portions 568, 570, as follows: First, the adhesive surface 468 of one tape 462 is faced radially outward, and one end portion thereof is introduced into an inner space of the cylindrical portion 568 through the slit of the same 568. Then, the adhesive tape 468 is adhered to the inner surface of the cylindrical portion 568 and thus one tape 462 is secured to the intermediate plate 565. Similarly, the other adhesive tape 462 is wound around the outer surface of the cylindrical portion 570, then adhered to the inner surface of the same 570, and thus secured to the reel cover 566.

The adhesive tapes 462 are wound around the intermediate plate 565 and the reel cover 566, respectively, as described above, while the two members 565, 566 are detached apart from the base member 564. After the winding of the adhesive tapes 462, the intermediate plate 565 is engaged with the engagement portion 572 of the base member 564 such that one tape 462 wound around the plate 565 is stretched out. Subsequently, the reel cover 566 is engaged with the engagement portion 572 of the base member 564 such that the other tape 462 wound around the plate 566 is stretched out. Then, the two members 565, 566 are rotated relative to the engagement portion 572 so that the two tapes 462 are stretched out. Thereafter, a holddown plate 573 is fixed with bolts 575 to the engagement portion 572 such that the intermediate plate 565 and the reel cover 566 are sandwiched between the holddown plate 573 and the base member 564. Thus, the two members 565, 566 are made immovable relative to the base member 564 such that the two tapes 462 are tightly wound around the two members 565, 566, respectively. Thus, the take-up reel 552 has two tape-accommodating spaces 574, 574 arranged side by side in an axial direction thereof. The two adhesive tapes 462 are taken up and accommodated in the two spaces 574, respectively.

A first and a second one-way clutch 578, 580 are provided between the axis member 558, and the support member 562 and the take-up lever 554. The first one-way clutch 578 inhibits the take-up lever 554 from rotating relative to the support member 562 in a taking-up direction (i.e., clockwise direction in FIG. 21) in which the adhesive tapes 462 are taken up by the take-up reel 552, and permits the same 554 to rotate in the reverse direction. The second one-way clutch 580 permits the support member 562 to rotate in the taking-up direction and inhibits the same 562 from rotating in the reverse direction.

Figure 24:
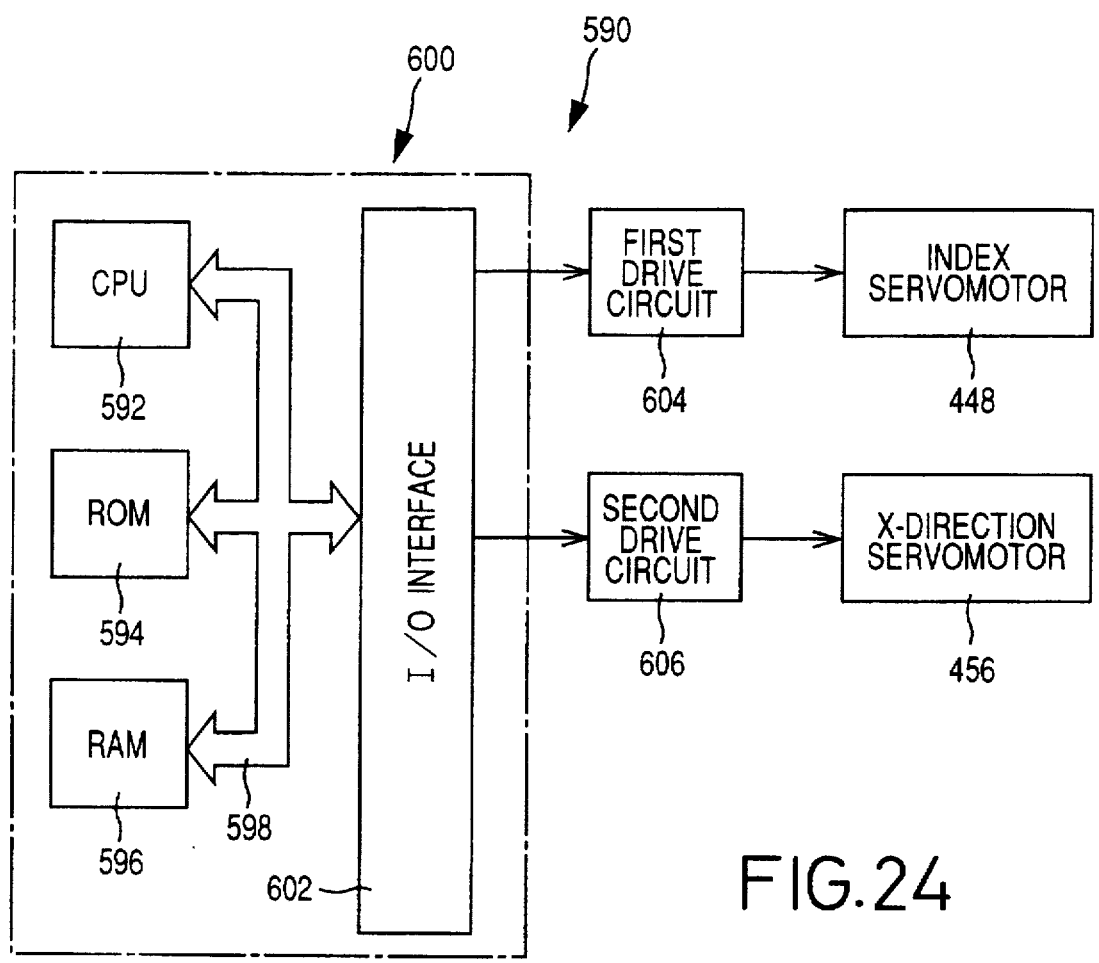
FIG. 24 is a diagrammatic view of a control device of the mounting system of FIG. 17.

The EC mounting system in accordance with the fourth embodiment is controlled by a control device 590 shown in FIG. 24. The control device 590 is essentially provided by a computer 600 including a CPU 592, a ROM 594, a RAM 596, and bus 598 connecting the elements 592, 594, 596 with one another. An input and output (I/O) interface 602 is connected to the bus 598, and the index servomotor 448 and the X-direction servomotor 456 are connected to the I/O interface 602 via a first and a second drive circuit 604, 606, respectively.

The spring 522 biases the drive lever 514 as shown in FIG. 21. In this state, the leading one of the ECs 460 is located at the EC supplying position on the EC supplying cartridge 452, and the cover member 482 is located at the advanced position where the cover 482 covers the leading EC 460. After one cartridge 452 is indexed and moved to the EC picking-up position, the suction nozzle 449 is moved downward through the notch 538 of the tongue member 536 of the cover 482 and the spacing between of the two adhesive tapes 462, and attracts the EC 460 by air suction. Subsequently, an actuator lever 610 is rotated and the drive lever 514 is rotated against the biasing force of the spring 522.

The actuator lever 610 is rotated by the index servomotor 448 via a cam, a cam follower, and a motion transmitting mechanism (all not shown). The suction nozzle 449 is moved downward and upward at the EC picking-up position by an actuator member of a nozzle moving device (not shown). This actuator member is moved upward and downward by the index servomotor 448 via a cam, a cam follower, and a motion transmitting mechanism (all not shown). The rotary motion of the motor 448 is converted into the linear motion of the actuator member by the cam, cam follower, and motion transmitting mechanism. In the present embodiment, while the intermittent rotation of the index table 444 is stopped, the feeding of the carrier tape 467, the taking-up of the adhesive tapes 462, and the picking-up of the EC 460 by the suction nozzle 449 are carried out at predetermined timings relative to one another.

When the drive lever 514 is rotated, the rotary plate 494 is rotated in the reverse direction so that the ratchet pawl 498 moves over the teeth 500 of the ratchet wheel 492 and the cover member 482 is moved to the retracted position. On the other hand, the ratchet wheel 492 is not rotated, so that the leading one of the ECs 460 carried on the carrier tape 467 is kept at the EC supplying position, i.e., EC picking-up position.

As the actuator lever 610 is rotated, the take-up lever 554 is biased by the spring 560 and is rotated in the taking-up direction, so that the take-up reel 552 is rotated to take up the adhesive tapes 462. Thus, the taking-up of the adhesive tapes 462 and the retracting movement of the cover member 482 are simultaneously carried out. When the cover 482 is retracted, the adhesive tapes 462 are peeled off the leading EC 460 and taken up by the take-up reel 552. Portions of the EC 460 from which the adhesive tapes 462 have not been peeled are held down by the tongue member 536 of the cover 482. Thus, the tongue member 536 effectively prevents the EC 460 from moving with the adhesive tapes 462 out of the EC accommodating hole 466 when the tapes 462 are peeled off the EC 460. In particular, since the adhesive tapes 462 are folded back over about 180 degrees at the downstream-side ends of the tongue member 536, the force produced to peel the adhesive tapes 462 from the EC 460 and the spacer tape 464 is applied to the EC 460 in a direction substantially parallel to the EC 460 and the spacer tape 464. Thus, the force to move up the spacer tape 464 or raise the EC 460 is minimized. However, since the portions of the EC 460 being held down by the tongue 536 become small just before the peeling of the adhesive tapes 462 from the leading EC 460 is finished, it is possible that the EC 460 be raised with the tapes 462. However, the moment to raise the EC is very low, and the attraction of the suction nozzle 449 effectively prevents the EC 460 from being raised up in the pocket 466.

When the cover member 482 is moved to the retracted position, the tongue member 536 is completely moved away from the EC 460, so that the suction nozzle 449 becomes able to pick up the EC 460 from the EC accommodating hole 466. At the retracted position, the cover member 482 covers the next or following EC 460 that is adjacent to the leading EC 460 located at the EC supplying position, on the upstream side of the leading EC 460 in the EC feeding direction.

After the leading EC 460 is picked up, the actuator lever 610 is rotated in the reverse direction, and the rotary plate 494 is rotated in the forward direction to feed the carrier tape 467 forward in the EC feeding direction. The forward rotation of the rotary plate 494 is limited or stopped when the ratchet pawl 498 abuts on a stopper projection 612. Thus, the new, leading EC 460 is located at the EC supplying position. Since the cover member 482 is moved forward to the advanced position, together with the carrier tape 467, the leading EC 460 adhered to the adhesive tapes 462 is fed forward while being covered by the tongue member 536.

When the cover member 482 is advanced, the movable roller 548 is moved in the rightward direction in FIG. 21, so that the adhesive tapes 462 stretched between the fixed roller 546 and the take-up reel 552 is loosened. In the present embodiment, the amount of this loosening of the adhesive tapes 462 is pre-determined such that the amount is not less than a length equal to the feeding pitch of the carrier tape 467. Therefore, when the carrier tape 467 is fed forward, the adhesive tapes 462 are not peeled off. Even though the take-up lever 554 may be rotated in the direction opposite to the taking-up direction, the rotation of the lever 554 is not transmitted to the take-up reel 552 and accordingly the adhesive tapes 462 are not peeled off. The looseness of the adhesive tapes 462 is eliminated when the movable roller 548 is moved in the leftward direction in FIG. 21 to take up the adhesive tapes 462.

The feeding pitch of the carrier tape 467 may be adjusted by changing the position of attachment of the drive lever 514 to the bracket 518 and thereby changing the amount of rotation of the rotary plate 494 in the reverse or backward direction.

The diameter of the adhesive tapes 462 being wound around the take-up reel 552 increases little by little. The greater the diameter becomes, the smaller the angle of rotation of the take-up reel 552 becomes which is needed to take up a length of the adhesive tapes 462 which is equal to the feeding pitch of the carrier tape 467. This rotation-angle change, however, is accommodated by the change of the spacing between the drive lever 514 and the take-up lever 554. More specifically described, when the adhesive tapes 462 are peeled off by just a length equal to one feeding pitch, the tension of the adhesive tapes 462 abruptly exceeds the biasing force of the spring 560, so that the respective rotations of the take-up lever 554 and the take-up reel 552 are stopped and so that a spacing is created between the drive lever 514 and the take-up lever 554. The time of creation of this spacing becomes earlier as the diameter of the adhesive tapes 462 being wound around the take-up reel 552 becomes greater.

As is apparent from the foregoing description, the actuator lever 610, drive lever 514, take-up lever 554, and spring 560 cooperate with the index servomotor 448, cam, cam follower, and motion transmitting mechanism to provide a rotating device which rotates the take-up reel 552; and the actuator lever 610, drive lever 514, drive plate 524, and spring 522 cooperate with the index servomotor 448 and etc. to provide a moving device which moves the cover member 482.

In the fourth embodiment, the single take-up reel 552 has the two tape accommodating spaces 574 for taking up the two adhesive tapes 462, respectively. However, it is possible to employ two take-up reels each of which has a single tape accommodating space for taking up a single adhesive tape. In the latter case, the two take-up reels may be provided on a cartridge frame of an EC supplying cartridge such that each reel is rotatable about an axis line perpendicular to a lengthwise direction of the adhesive tape and parallel to the adhesive surface of the same and such that each reel is equipped with a take-up lever biased by a spring in a tape taking-up direction. The two take-up levers may be provided on opposite sides of a unit of the take-up reels, respectively, and may be rotated by a common drive lever. Thus, the two adhesive tapes are simultaneously taken up by the two take-up reels, respectively.

In addition, it is possible that the adhesive tapes 462 be taken up by the tape accommodating spaces 574 of the take-up reel 552 such that the adhesive surfaces 468 are faced radially downward. In this case, the end portions of the adhesive tapes 462 may be adhered to the outer surfaces of the cylindrical portions 568, 570 of the take-up reel 552, and the cylindrical portions 568, 570 may not be provided with the slits through which end portions of the adhesive tapes 462 are introduced. The end portions of the adhesive tapes 462 are easily secured to the take-up reel 552 without having to be adhered to the inner surface of the cylindrical portions 568, 570.

In the fourth embodiment, the cover member 482 is moved by utilizing the movement of the drive lever 514 for feeding the carrier tape 467. However, the cover 482 may be moved by utilizing the movement of the adhesive tapes 462 for being taken up by the take-up reel 552. In the latter case, the cover is attached to the cartridge frame 480 such that the cover is movable in the EC feeding direction and is biased by a biasing member toward the downstream side thereof. A stopper is provided which stops the movement of the cover being biased, at a position where a tongue portion of the cover covers the leading EC 460 located at the EC supplying position. When the adhesive tapes 462 are taken up, the cover is pushed by the tapes 462 being taken up and is moved to its retracted position against the biasing action of the biasing member. When the carrier tape 467 is fed forward, the cover is biased by the biasing member and is moved to its advanced position where the tongue portion thereof covers the EC 460 located at the EC supplying position.

In the fourth embodiment, when the adhesive tapes 462 are peeled off, each EC 460 is prevented from moving with the tapes 462, by the cover member 482 provided on each EC supplying cartridge 452 and the suction nozzle 449. However, it is possible to employ an EC-movement preventing device 630, shown in FIGS. 25 and 26, which commonly serves for a plurality of EC supplying cartridges each of which has the same construction as that of the cartridge 452 shown in FIGS. 17 through 24 except that the former cartridges do not have a member corresponding to the cover member 482 of the latter cartridges. The former cartridges have the same take-up device as the take-up device 550 of the latter cartridges.

In the present, fifth embodiment, the EC-movement preventing device 630 is provided adjacent to an EC supplying position in a length-wise direction of the EC supplying cartridge located in alignment with an EC picking-up position. The preventing device 630 includes a main frame 632, a pair of guide rails 634, and a movable member 636. The guide rails 634 extend parallel to the length-wise direction of the EC supplying cartridge. The movable member 636 is movably supported on the guide rail 634. Two pairs of links 638 are connected to two portions of the movable member 636 which are distant from each other in the direction of movement of the movable member 636. More specifically, one end of each of the four links 638 is connected to the movable member 636 such that each link 638 is rotatable about an axis line perpendicular to the direction of the movement of the movable member 636 in a horizontal plane. The other end of each of the four links 638 is rotatably connected to an arm member 640. Thus, the movable member 636, four link members 638, and arm member 640 cooperate with one another to provide a parallelogram-link device.

One pair of links 638 of the two pairs which are more remote from the EC supplying cartridge than the other pair, are fixed to an axis member 641 which is rotatably supported by the movable member 636. One end portion of a lever 642 is also fixed to the axis member 641. The other end portion of the lever 642 is connected via a coupling member 648 to a piston rod 646 of an air cylinder 644, such that the lever 642 is rotatable relative to the piston rod 646. The air cylinder 644 is rotatably attached to the main frame 632.

The arm member 640 is biased rearward by a tension coil spring 650 as a biasing member provided between the arm member 640 and the movable member 636. The arm 640 is moved rearward by the spring 650 toward a retracted position thereof where the reward movement of the arm 640 is stopped by a stopper 651 provided on the movable member 636. When the piston rod 646 is advanced, first, the arm 640 and the movable member 636 are advanced together and, after the movable member 636 abuts on the stopper 652 and the frontward movement thereof is stopped, the links 638 are rotated over 90 degrees and the rotations thereof are stopped by a stopper 653.

A front end portion of the arm 640 is bent downward and is further bent frontward to provide a horizontal portion 654. Two holddown projections 656 project downward from two portions of a lower surface of the horizontal portion 654 which are distant from each other in the length-wise direction of the EC supplying cartridge. Each holddown projection 656 extends in a widthwise direction of the cartridge, and has a length smaller than the spacing between the two adhesive tapes 462 of the carrier tape 467. The horizontal portion 654 also has a notch 658 which opens toward the EC supplying cartridge and extends in the direction of movement of the movable member 636.

After one of the EC supplying cartridges is moved to the EC picking-up position for mounting an EC 460 on a PCB 24 (FIG. 1), the piston rod 646 is advanced, and accordingly the movable member 636 is advanced and the links 638 are rotated. Consequently the holddown projections 656 of the arm member 640 are first advanced in a horizontal direction and then are rotated downward over 90 degrees, so that the projections 656 are stopped in contact with, or adjacent to, an upper surface of the EC 460, between the two adhesive tapes 462. This position of the arm member 640 is an operative position thereof.

Subsequently, the suction nozzle 449 is moved downward through the notch 658 of the horizontal portion 654 and attracts the EC 460 by air suction. Thereafter, the adhesive tapes 462 are peeled off. Since the EC 460 is held down by the holddown projections 656 and is held by the suction nozzle 449, the EC 460 is prevented from being raised up or moved with the adhesive tapes 462. After the adhesive tapes 462 are peeled off, the piston rod 646 is retracted and accordingly the holddown projections 656 are moved away from the EC 460. Simultaneously, the suction nozzle 449 is moved upward to pick up the EC 460 from the EC accommodating hole 466.

In the fifth embodiment, the arm member 640 having the holddown projections 644 provides an EC-movement preventing member; and the air cylinder 644, links 638, lever 642, spring 650, movable member 636, etc. cooperate with one another to provide a moving device for moving the EC-movement preventing member.

Figure 27:
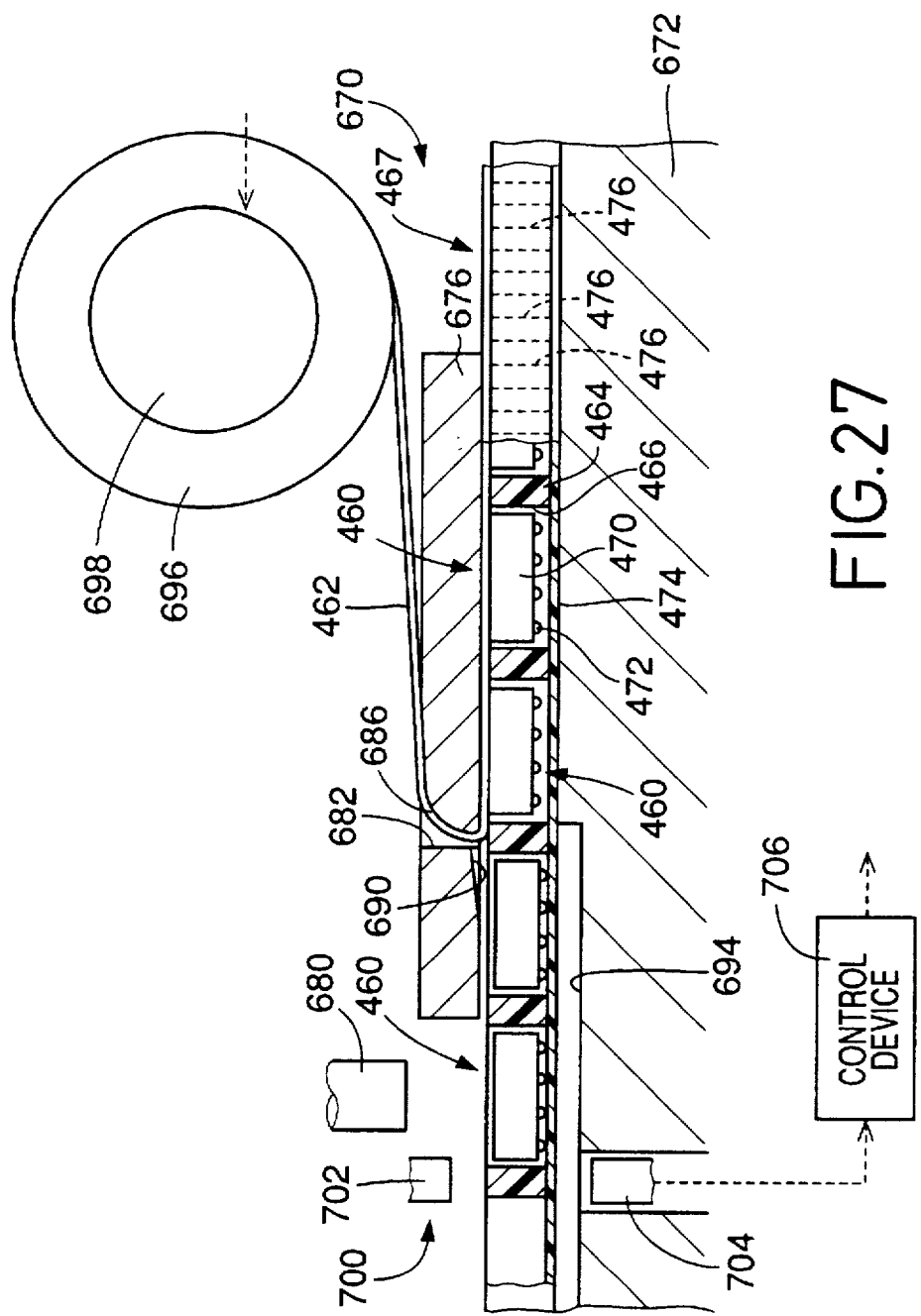
FIG. 27 is a longitudinal cross-section view of an EC removing device as a sixth embodiment of the present invention.
Figure 28:
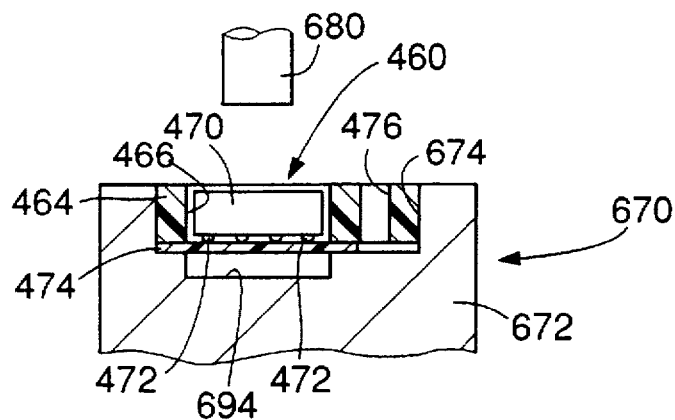
FIG. 28 is a transverse cross-section view of the EC removing device of FIG. 27.
Figure 29:
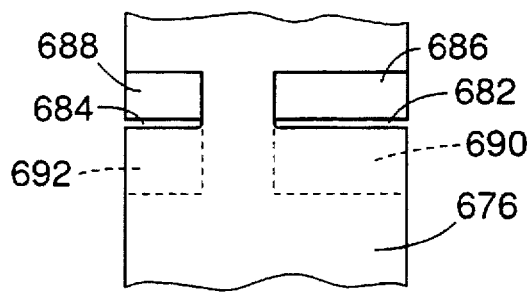
FIG. 29 is a plan view of a portion of a cover member of the EC removing device of FIG. 27.

FIGS. 27 through 29 shows a sixth embodiment of the present invention. The sixth embodiment has the same construction as that of the fourth embodiment shown in FIGS. 17 through 24, except that in the sixth embodiment a take-up reel 696 is rotated by a reel drive motor 698 and that a carrier tape 467 is fed forward by utilizing the rotation of the take-up reel 696.

As shown in FIG. 28, the carrier tape 467 is fed in a guide groove 674 formed in a cartridge frame 672 of an EC supplying cartridge 670. As shown in FIG. 27, the carrier tape 467 is covered by a cover member 676 which is attached to the cartridge frame 672. However, the cover member 676 does not cover the leading one of the ECs 460 carried on the carrier tape 467 which is located at an EC supplying position of the cartridge 670 where the leading EC 460 is attracted by air suction by a suction head or nozzle 680. That is, the cover 676 covers the ECs 460 located on the upstream side of the leading EC 460 in the EC feeding direction.

The cover member 676 has two slits 682, 684 at a position corresponding to a partition wall of the spacer tape 464 between two adjacent EC accommodating holes 466 which are adjacent to the leading EC 460 on the upstream side thereof in the EC feeding direction. As shown in FIGS. 27 and 29, the two slits 682, 684 open in two side surfaces of the cover 676, respectively, each of which extends parallel to a lengthwise direction thereof, and have respective lengths greater than the respective widths of the corresponding adhesive tapes 462. The slits 682, 684 are partly defined by part-cylindrical guide surfaces 686, 688, respectively, which are provided on the upstream-side thereof in the EC feeding direction. Thus, the slits 682, 684 open upward such that the dimension thereof in the EC feeding direction is greater at an upper portion thereof than a lower portion thereof.

The cover member 676 also has, in the lower surface thereof, two inclined surfaces 690, 692 which are continuous with the two slits 682, 684, respectively, on the downstream side thereof in the EC feeding direction. The inclines surfaces 690, 692 are inclined rearward and upward toward the slits 682, 684, respectively. As shown in FIGS. 27 and 28, the cartridge frame 672 has a cushion groove 694 which is provided on the downstream side of the slits 682, 684. The cushion groove 694 opens upward in the guide groove 674 and has a width equal to that of the EC accommodating holes 466 of the carrier tape 467.

After being drawn through the slits 682, 684, the two adhesive tapes 462 are taken up by the take-up reel 696. The take-up reel 696 is attached to a bracket (not shown) fixed to the cartridge frame 672, such that the reel 696 is rotatable about a horizontal axis line perpendicular to the EC feeding direction. Similar to the take-up reel 552 shown in FIG. 21, the take-up reel 696 has two tape accommodating spaces which are apart from each other in an axial direction thereof. The two adhesive tapes 462 are taken up and stored in the two spaces of the take-up reel 696, respectively. The take-up reel 696 is rotated by a reel drive motor 698 to take up the adhesive tapes 462.

The cartridge frame 672 is provided with a transmission-type photoelectric sensor 700, on the downstream side of the EC supplying position in the EC feeding direction. The sensor 700 includes a light emitter 702 provided above the tape feeding holes 476 of the spacer tape 464, and a light receiver 704 provided below the same 476. The light receiver 704 generates a detection signal representing the detected light, and supplies the signal to a control device 706. Based on the detection signal supplied from the sensor 700, the control device 706 controls the operation of the reel drive motor 698.

When the take-up reel 696 is rotated, the adhesive tapes 462 are peeled off the spacer tape 464 and each EC 460. When the adhesive tapes 462 are peeled off the EC 460 by being drawn by the take-up reel 696, the cover member 676 holds down the EC 460, thereby preventing the EC 460 from moving with the tapes 462 out of the EC accommodating hole 466. On the other hand, because of the tension force applied to the adhesive tapes 462, the spacer tape 464 is drawn forward, so that the carrier tape 467 is fed forward. When the carrier tape 467 is fed forward, the photoelectric sensor 700 generates a detection signal each time each tape feeding hole 476 of the spacer tape. 464 passes between the light emitter and receiver 702, 704. When the sensor 700 generates the number of detection signals which corresponds to the tape feeding pitch, i.e., distance between the respective centers of each pair of adjacent two EC accommodating holes 466, the control device 706 stops the operation of the reel drive motor 698. After the one-pitch feeding of the carrier tape 467, the suction head 680 is moved downward to attract the EC 460 by air suction and pick up the EC 460 from the hole 466.

Since the inclined surfaces 690, 692 are provided adjacent to the slits 682, 684, in the lower surface of the cover member 676, the ECs 460 are smoothly fed without being jammed with the lower ends of the slits 682, 684, when the ECs 460 are passed under the slits 682, 684 after the adhesive tapes 462 are peeled therefrom. After the adhesive tapes 462 are peeled off each EC 460, the EC 460 falls onto the bottom tape 474. However, since the cartridge frame 672 has the cushion groove or hollow space 694 on the downstream side of the slits 682, 684, the solder bumps 472 of each EC 460 are effectively prevented from colliding with the cartridge frame 672 via the bottom tape 474 or being damaged because of the collision.

While the present invention has been described in its preferred embodiments, the present invention may otherwise be embodied.

For example, in the fourth embodiment, the sprocket 490 shown in FIG. 21 may be rotated by an electric motor for feeding the carrier tape 467. A sensor may be provided for counting the number of tape feeding holes 476 of the spacer tape 464 and, based on the counted number, the rotation of the motor may be controlled so that the carrier tape 467 is intermittently fed by the predetermined feeding pitch. In this case, it is preferred that a pair of feed rollers be employed for pinching and drawing the adhesive tapes 462 and thereby peeling the same 462 from each EC 460. The peeled tapes 462 may be collected in an appropriate container. It is also preferred that a rotation transmitting device be employed for transmitting the rotation of the sprocket to the feed rollers for rotating the same. Like the sixth embodiment shown in FIGS. 27 through 29, a cover member may be fixed to a cartridge frame, and the adhesive tapes 462 may be peeled off at a position on the upstream side of the EC supplying position in the EC feeding direction. Alternatively, the adhesive tapes 462 may be peeled off at the EC supplying position, and the backward movement of a cover member from the EC supplying position toward its retracted position and the taking-up of the adhesive tapes 462 may simultaneously be carried out by a drive device different from a drive device for feeding the carrier tape 467.

Figure 25:
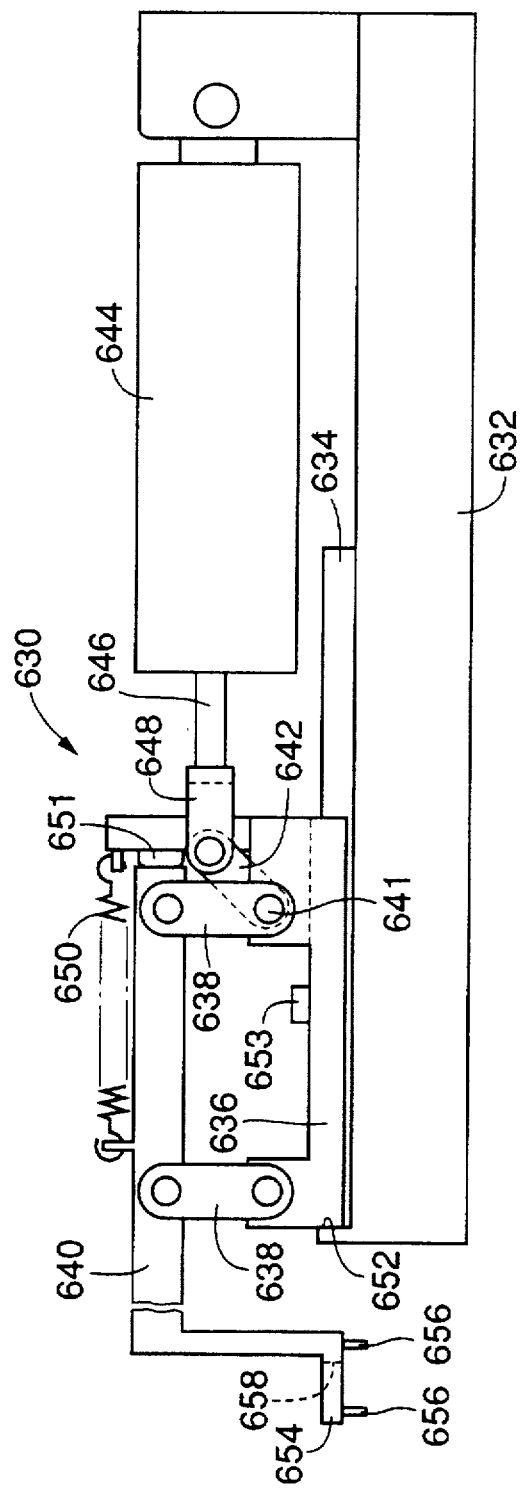
FIG. 25 is a side view of an EC-movement preventing device of an EC removing device as a fifth embodiment of the present invention.
Figure 26:
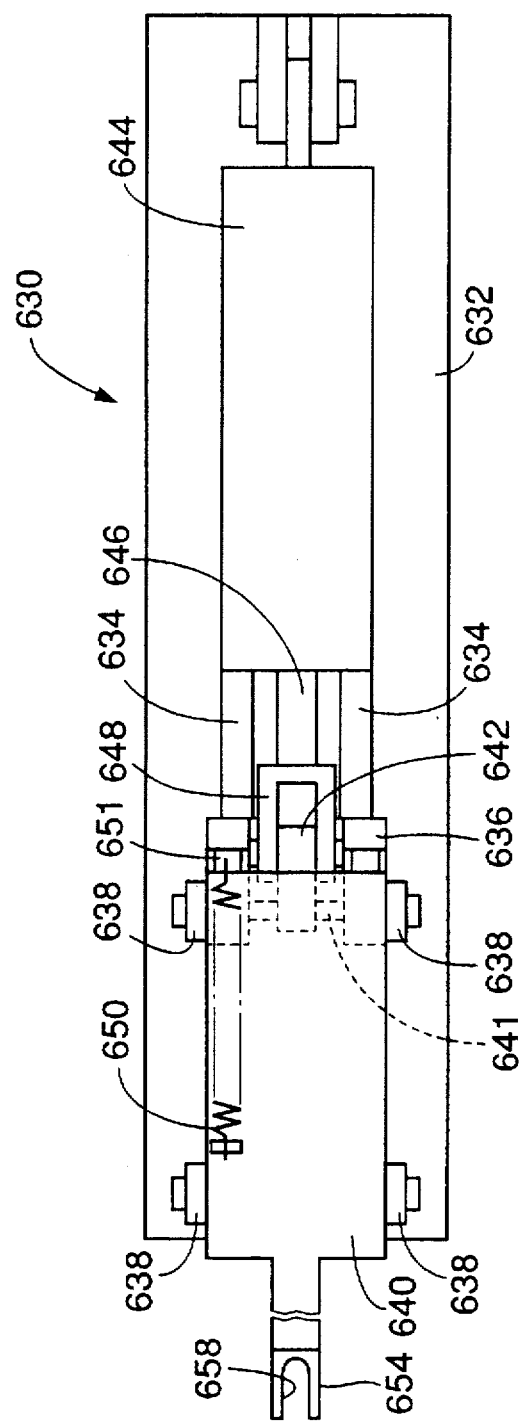
FIG. 26 is a plan view of the EC-movement preventing device of FIG. 25.

In the fifth embodiment shown in FIGS. 25 and 26, the adhesive tapes 462 are peeled off while the suction nozzle 449 holds the EC 460 by air suction. However, the suction nozzle 449 may be adapted to attract the EC 460 after the adhesive tapes 462 are peeled off.

Figure 30:
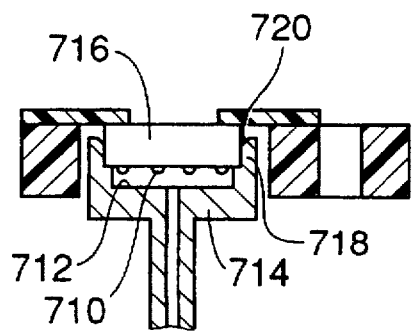
FIG. 30 is a transverse cross-section view of an EC suction member of an EC removing device as a seventh embodiment of the present invention, showing a state in which the suction member catches an EC.

In each of the fourth to sixth embodiments the EC-movement preventing device which covers or contacts the upper surface of each EC 460 prevents the movement of each EC 460 when the adhesive tapes 462 are peeled off. However, it is possible to prevent the movement of each EC 460 by acting on a side or lower surface of the same 460. For example, the movement of each EC 460 may be prevented by a suction device which attracts by air suction the lower surface thereof, or a holding device which holds side surfaces thereof. In the case where the air suction is applied to the lower surface of each EC 460 which has the solder bumps 472, it is possible to attach a cushion member formed of a resilient material such as rubber, to a contact surface of a suction member of the suction device to which the EC 460 is attracted. Otherwise, as shown in FIG. 30, an EC 716 may be attracted by a suction member 714 which has a recess 712 formed in a portion thereof corresponding to a portion of the EC 716 which has solder bumps 710. In the last case, the suction member 714 does not contact the solder bumps 710. It is preferred that the suction member 714 be provided with positioning portions 718 which are engageable with the side surfaces of the EC 716, and guide surfaces 720 which guide or facilitate the engagement of positioning portions 718 and the EC 716.

In the fourth embodiment shown in FIGS. 17 through 24, the peeling of the adhesive tapes 462 from each EC 460 and the air suction of the EC 460 by the suction nozzle 449 (i.e., the picking-up of the EC 460) are carried out at the same position in the EC feeding direction, i.e., the EC supplying position. However, a tape-peeling position where the adhesive tapes 462 are peeled off each EC 460 may be located on the upstream side of the EC supplying position. In the latter case, the adhesive tapes 462 are peeled off the EC 460 before the EC 460 is picked up by the suction nozzle 449. For example, as disclosed in Japanese Patent Application laid open for opposition purposes under Publication No. 2(1990)-50640, a cover member may be employed which is provided on the cartridge frame 480 such that the cover member is movable between its advanced position where the cover member covers an EC located at the EC supplying position, and its retracted position away from the advanced position. When the carrier tape 467 is fed forward by the tape feeder 484, the cover is moved from the retracted position to the advanced position, together with the carrier tape 467. When the tape feeder 484 prepares for the next one-pitch tape feeding, the cover is moved back to the retracted position. While the cover is located at the retracted position, the adhesive tapes 462 are peeled off the leading EC 460. Subsequently the cover is moved to the advanced position together with the carrier tape 467, while covering the leading EC 460, and then the cover is moved back to the retracted position. The cover has an opening through which each EC 460 is picked up by the suction nozzle 449 and which is provided with a tongue member having a notch continuous with the opening. After the cover is moved to the advanced position, the suction nozzle 449 is moved downward through the notch of the tongue and is operated to attract the EC 460 by air suction. Thereafter, the cover is moved to the retracted position and subsequently the adhesive tapes 462 are taken up by the take-up device 550. Although the adhesive tapes 462 are peeled off each EC 460 before the EC 460 is moved to the EC supplying position, the EC 460 is prevented from jumping out of the EC accommodating hole 466, because opposite end portions of the EC 460 in a direction perpendicular to the EC feeding direction are covered by two portions of the tongue, respectively. Thus, the EC 460 is picked up by the suction nozzle 449, with high reliability. While each EC 460 is fed from the tape-peeling position to the EC supplying position, the solder bumps 472 are kept in contact with the bottom tape 474. However, the distance between the two positions is very short and accordingly the EC 460 is fed without any problem. Like in the sixth embodiment shown in FIGS. 27 to 29, the cartridge frame 480 may be provided with a cushion groove on the downstream side of the tape-peeling position. The cushion groove or hollow space provided under the bottom tape 474 more effectively prevents the solder bumps 472 from being damaged. The tongue member may be omitted. In the last case, the suction nozzle 449 may be moved downward after the cover is moved to the retracted position and the leading EC 460 is fully exposed.

The EC-movement preventing device that prevents the movement of each EC 460 when the adhesive tapes 460 are peeled off the EC 460, may be provided on the EC suction head. For example, a movable member which supports the suction nozzle 449 and is movable downward and upward, may be provided with a holddown member which can contact the upper surface of each EC 460 and thereby prevent the movement of the EC 460. When the adhesive tapes 462 are peeled off the EC 460, the holddown member is moved downward by a holddown-member drive device, so as to contact the EC 460 and thereby prevent the movement thereof. After the peeling of the adhesive tapes 462, the suction nozzle 449 attracts the EC 460 by air suction and then the holddown member is moved upward away from the EC 460. Thus, the EC 460 is picked up by the suction nozzle 449 without being raised in the EC accommodating hole 466.

In each of the fourth to seventh embodiments shown in FIGS. 17 through 30, the carrier tape 467 includes the spacer tape 464 for protecting the ECs 460. However, the spacer tape 464 may be omitted from the carrier tape 467, in the case where the carrier tape 467 can be fed under the condition that the solder bumps 472 do not contact other elements including the adhesive tapes 462.

In each of the first to third embodiments, the EC removing device 20 hands over each EC 70 removed from which the adhesive tapes 78, to the EC mounting device 18. However, the EC removing device 20 may be adapted to hand over each EC 70 to a device of a different sort from the EC mounting device, such as an EC conveying device which conveys the EC 70 to a position away from the EC removing position.

The present invention may be embodied by changing one or more of the individual elements of each of the illustrated embodiments, with one or more of those of another or others of the illustrated embodiments.

It is to be understood that the present invention may be embodied with other changes, improvements, and modifications that may occur to those skilled in the art without departing from the scope and spirit of the invention defined in the appended claims.

What is claimed is:

1. An electronic-component removing system for removing each of a plurality of electronic components from a carrier tape including at least one elongate adhesive tape to which the components are adhered at a regular interval of distance in a length-wise direction of the adhesive tape, the adhesive tape having at least one opening formed through the thickness thereof, said each of the components adhered to the adhesive tape being exposed through the opening, the removing system comprising:

a supplying device which supports the carrier tape and feeds the carrier tape in a feeding direction parallel to the length-wise direction of the adhesive tape;

a thrusting device provided on one side of the adhesive tape of the carrier tape supported by said supplying device, said one side of the adhesive tape being opposite to the other side thereof on which the components are, said thrusting device including a thrust member and a first actuator which moves said thrust member between a thrusted position thereof and a retracted position thereof through the opening of the adhesive tape in a thrusting direction substantially perpendicular to the feeding direction; and a receiving device provided on one side of the components of the carrier tape supported by said supplying device, said one side of the components being opposite to the other side thereof on which the adhesive tape is, said receiving device including a holder which holds said each of the components adhered to the adhesive tape, a movable member which supports said holder such that the holder is movable relative thereto, and a second actuator which moves said movable member between an electronic-component removing position thereof in which the holder supported by the movable member is opposed via said each component to said thrust member, and a different position thereof away from the removing position, said first actuator moving, when said movable member is positioned at the removing position thereof, said thrust member to the thrusted position thereof through the opening of the adhesive tape to thrust said each component toward said holder, move the holder with said each component relative to the movable member in said thrusting direction and thereby remove said each component from the adhesive tape.

2. A system according to claim 1, wherein said supplying device comprises a stopper member provided on said one side of the components, said stopper member stopping a movement of the adhesive tape in the thrusting direction when said thrust member is moved to the thrusted position by said first actuator.

3. A system according to claim 1, wherein said movable member of said receiving device comprises a rotatable arm which is rotatable about an axis line parallel to an adhesion surface of the adhesive tape to which the components are adhered, and wherein said holder of the receiving device is supported by said rotatable arm such that the holder is movable relative to the arm in a direction tangent to a locus of movement thereof drawn when the arm is rotated by said second actuator.

4. A system according to claim 1, wherein said receiving device further comprises a supporting device which supports said holder, allows the movement of the holder relative to said movable member, and stops the movement of the holder at a position within a predetermined range relative to the movable member, and a returner which returns the holder stopped by said supporting device at a position to which the holder is moved with said each component relative to the movable member when said thrust member is moved to the thrusted position, to an initial position thereof corresponding to one of opposite ends of the predetermined range.

5. A system according to claim 1, wherein said receiving device further comprises a cushion member formed of a resilient material, said cushion member being provided on an end face of said holder at which the holder contacts said each component.

6. A process of mounting each of a plurality of electronic components on a printed circuit board, comprising the steps of:

supporting a carrier tape including at least one elongate adhesive tape to which the components are adhered at a regular interval of distance in a length-wise direction of the adhesive tape, the adhesive tape having at least one opening formed through the thickness thereof, said each of the components adhered to the adhesive tape being exposed through the opening, feeding the carrier tape in a feeding direction parallel to the length-wise direction of the adhesive tape, moving a thrust member between a thrusted position thereof and a retracted position thereof through the opening of the adhesive tape, in a thrusting direction substantially perpendicular to the feeding direction, moving a movable member between an electronic-component removing position thereof in which a holder supported by the movable member is opposed via said each component to the thrust member and, when the thrust member is moved to the thrusted position through the opening of the adhesive tape to thrust said each component toward the holder, the holder is moved with said each component relative to the movable member in the thrusting direction to remove said each component from the adhesive tape, and a different position thereof away from the removing position, and mounting said each component removed from the adhesive tape, on the printed circuit board.

7. A process according to claim 6, further comprising the step of stopping a movement of the adhesive tape in the thrusting direction when the thrust member is moved to the thrusted position.

8. A process according to claim 6, wherein the step of moving the movable member comprises rotating a rotatable arm as the movable member about an axis line parallel to an adhesion surface of the adhesive tape to which the components are adhered, the rotatable arm supporting the holder such that the holder is movable relative to the arm in a direction tangent to a locus of movement thereof drawn when the arm is rotated.

9. A process according to claim 6, further comprising the steps of:

allowing the movement of the holder relative to the movable member, stopping the holder at a position within a predetermined range relative to the movable member, and returning the holder stopped at a position to which the holder is moved with said each component relative to the movable member when the thrust member is moved to the thrusted position, to an initial position thereof corresponding to one of opposite ends of the predetermined range.

10. A process according to claim 6, further comprising the step of holding said each component with the holder including a cushion member formed of a resilient material, the cushion member being provided on an end face of the holder at which the holder contacts said each component.

11. An electronic-component removing system for removing each of a plurality of electronic components from a carrier tape including a pair of elongate adhesive tapes which are spaced apart from each other in a direction perpendicular to a length-wise direction of the adhesive tapes and to which the components are adhered at a regular interval of distance in the length-wise direction, a pair of opposite end portions of said each component being adhered to the two adhesive tapes, respectively, the removing system comprising:

a take-up reel which is provided on one side of the adhesive tapes opposite to the other side thereof on which the components are, such that said take-up reel is rotatable about an axis line perpendicular to the lengthwise direction of the adhesive tapes and parallel to respective adhesion surfaces of the adhesive tapes to which the components are adhered;

a drive device which rotates said take-up reel to peel the adhesive tapes from said each component and take up the adhesive tapes; and a component-movement preventing device which prevents said each component from being moved with the adhesive tapes when the adhesive tapes are peeled from said each component by said take-up reel.

12. A system according to claim 11, further comprising a holder which holds said each component from which the adhesive tapes have been peeled by said take-up reel.

13. A system according to claim 11, wherein said component-movement preventing device comprises a cover member which covers respective surfaces of the adhesive tapes opposite to the adhesion surfaces thereof, and an actuator which moves said cover member from an advanced position thereof where the cover member covers said each component located at a tape-peeling position, to a retracted position thereof away from the advanced position, when the adhesive tapes are peeled from said each component and taken up by said take-up reel, said actuator moving the cover member from the retracted position to the advanced position when the carrier tape is fed forward after the adhesive tapes are peeled from said each component.

14. A system according to claim 13, further comprising a holder which holds said each component carried on the carrier tape, wherein said cover member has a notch through which said holder is moved to hold said each component, said notch extending parallel to the length-wise direction of the adhesive tapes, and opening in a downstream-side end of the cover member in a direction in which the carrier tape is fed forward.

15. A system according to claim 11, wherein said component-movement preventing device comprises a preventing member and an actuator which moves said preventing member to an operative position thereof where the preventing member contacts a surface of said each component to which the adhesive tapes are adhered, and to an inoperative position thereof away from the operative position.

16. A system according to claim 11, wherein said take-up reel includes two take-up portions which are provided side by side on the axis line of rotation of the take-up reel and which take up the two adhesive tapes, respectively.

17. A process of mounting each of a plurality of electronic components on a printed circuit board, comprising the steps of:

supporting a carrier tape including a pair of elongate adhesive tapes which are spaced apart from each other in a direction perpendicular to a length-wise direction of the adhesive tapes and to which the components are adhered at a regular interval of distance in the lengthwise direction, a pair of opposite end portions of said each component being adhered to the two adhesive tapes, respectively, rotating a take-up reel to peel the adhesive tapes from said each component and take up the adhesive tapes, said take-up reel being provided on one side of the adhesive tapes opposite to the other side thereof on which the components are, such that the take-up reel is rotatable about an axis line perpendicular to the lengthwise direction of the adhesive tapes and parallel to respective adhesion surfaces of the adhesive tapes to which the components are adhered, preventing said each component from being moved with the adhesive tapes when the adhesive tapes are peeled from said each component, holding said each component from which the adhesive tapes have been peeled, and mounting the held component on the printed circuit board.

18. A process according to claim 17, wherein the step of preventing the movement of said each component comprises moving a cover member which covers respective surfaces of the adhesive tapes opposite to the adhesion surfaces thereof, from an advanced position thereof where the cover member covers said each component located at a tape-peeling position, to a retracted position thereof away from the advanced position, when the adhesive tapes are peeled from said each component and taken up by the take-up reel, and moving the cover member from the retracted position to the advanced position when the carrier tape is fed forward after the adhesive tapes are peeled from said each component.

19. A process according to claim 18, wherein the step of removing said each component comprising moving a holder to hold said each component, through a notch formed through a thickness of the cover member, the notch extending parallel to the length-wise direction of the adhesive tapes, and opening in a downstream-side end of the cover member in a direction in which the carrier tape is fed forward.

20. A process according to claim 17, wherein the step of preventing the movement of said each component comprises moving a preventing member to an operative position thereof where the preventing member contacts a surface of said each component to which the adhesive tapes are adhered, and to an inoperative position thereof away from the operative position.

21. A process according to claim 17, wherein the step of rotating the take-up reel comprising rotating the take-up reel including two take-up portions which are provided side by side on the axis line of rotation of the take-up reel and which take up the two adhesive tapes, respectively.

22. An electronic-component supplying cartridge for supplying each of a plurality of electronic components carried on a carrier tape including at least one elongate adhesive tape to which the components are adhered at a regular interval of distance in a length-wise direction of the adhesive tape, the adhesive tape having at least one opening formed through the thickness thereof, said each of the components adhered to the adhesive tape being exposed through the opening, the cartridge comprising:

a supplying device which supports the carrier tape and feeds the carrier tape in a feeding direction parallel to the length-wise direction of the adhesive tape; and a thrusting device provided on one side of the adhesive tape of the carrier tape supported by said supplying device, said one side of the adhesive tape being opposite to the other side thereof on which the components are, said thrusting device including a thrust member and an actuator which moves said thrust member between a thrusted position thereof and a retracted position thereof through the opening of the adhesive tape in a thrusting direction substantially perpendicular to the feeding direction, said thrust member being moved by said actuator to the thrusted position through the opening of the adhesive tape to thrust said each component and thereby remove said each component from the adhesive tape.

23. A cartridge according to claim 22, wherein said supplying device comprises a stopper member provided on said one side of the components, said stopper member stopping a movement of the adhesive tape in the thrusting direction when said thrust member is moved to the thrusted position by said actuator.

24. A cartridge according to claim 22, wherein said actuator comprises an air-cylinder device including a piston to which said thrust member is fixed, said air cylinder device moving said thrust member fixed to said piston, between the thrusted position and the retracted position through the opening of the adhesive tape.

* * * * *